United States Patent [19]

Kuroda

[11] Patent Number: 5,057,448
[45] Date of Patent: Oct. 15, 1991

[54] METHOD OF MAKING A SEMICONDUCTOR DEVICE HAVING DRAM CELLS AND FLOATING GATE MEMORY CELLS

[75] Inventor: Kenichi Kuroda, Tachikawa, Japan

[73] Assignee: Hitachi, Ltd., Tokyo, Japan

[21] Appl. No.: 308,700

[22] Filed: Feb. 10, 1989

[30] Foreign Application Priority Data

| Feb. 26, 1988 | [JP] | Japan | 63-44780 |
| Feb. 26, 1988 | [JP] | Japan | 63-44781 |
| Feb. 26, 1988 | [JP] | Japan | 63-44782 |
| Feb. 26, 1988 | [JP] | Japan | 63-44783 |

[51] Int. Cl.$^5$ .......................................... H01L 21/70
[52] U.S. Cl. ...................................... 437/52; 437/43; 437/47; 437/48; 437/49; 437/50; 437/60; 437/233; 437/235; 437/919
[58] Field of Search ............... 365/174, 228; 357/23.5, 357/23.6, 51, 43; 437/44, 60, 51, 52, 193, 195, 186, 228, 233, 48, 49, 50

[56] References Cited

U.S. PATENT DOCUMENTS

| 4,103,348 | 7/1978 | Fagan | 365/228 |
| 4,229,755 | 10/1980 | Custode | 437/52 |
| 4,373,249 | 2/1983 | Kosa et al. | 437/52 |
| 4,441,249 | 4/1984 | Alspector et al. | 437/233 |
| 4,466,177 | 8/1984 | Chao | 437/47 |
| 4,545,035 | 10/1985 | Guterman et al. | 365/185 |
| 4,586,238 | 5/1988 | Yatsuda et al. | 357/23.5 |
| 4,672,580 | 6/1987 | Yau et al. | 365/189 |
| 4,822,750 | 4/1989 | Perlegos et al. | 437/43 |

Primary Examiner—Brian E. Hearn
Assistant Examiner—Tom Thomas
Attorney, Agent, or Firm—Pennie & Edmonds

[57] ABSTRACT

In a semiconductor integrated circuit device having a dynamic type memory element (DRAM), a non-volatile memory element of FLOTOX structure and a MISFET, a dielectric film of an information storing capacitance element fo the DRAM and a tunnel insulation film of the non-volatile memory element are constituted in film thickness less than that of a gate insulation film of the MISFET. Thin dielectric film increases the charge storage quantity of the information storing capacitance element and decreases the occupation area of the DRAM. Thin tunnel insulation film increases the tunnel current quantity and decreases the information write time of the non-volatile memory element. Process of forming the dielectirc film and process of forming the tunnel insulation film are performed in the same process, thereby the manufacaturing process of the semiconductor integrated circuit device is reduced.

24 Claims, 18 Drawing Sheets

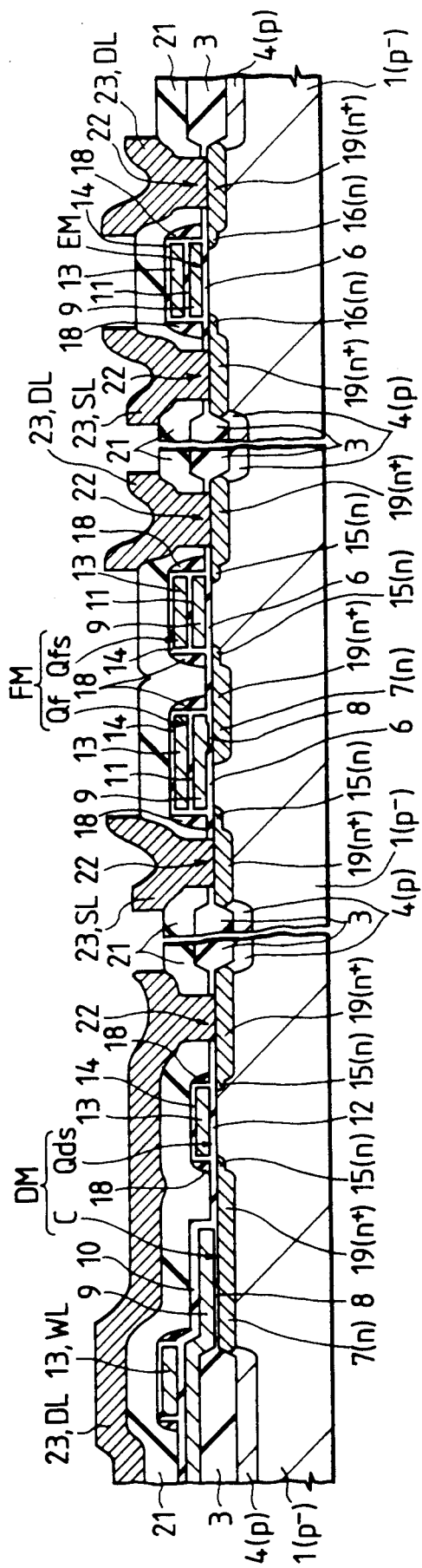
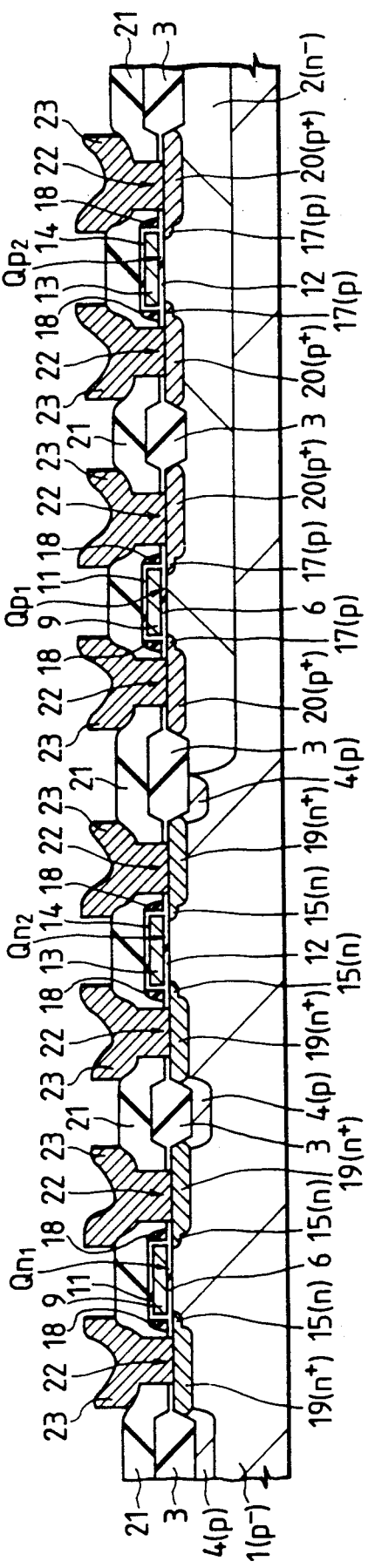
FIG. 1A
FIG. 1B

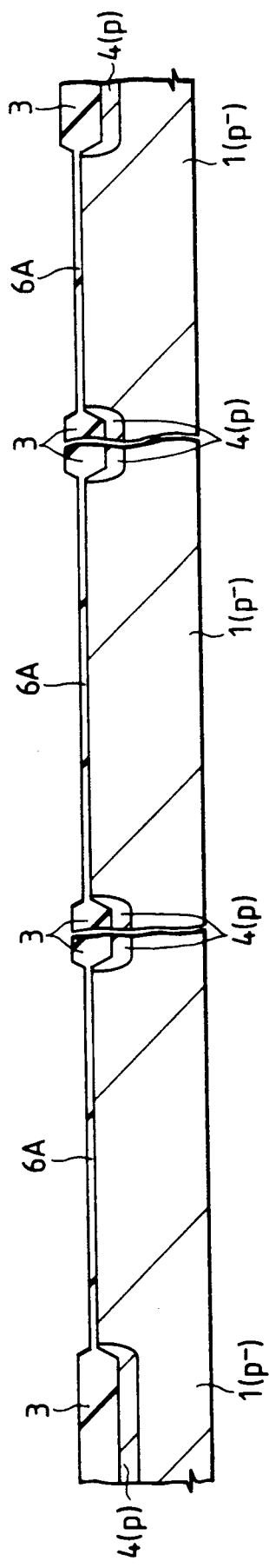
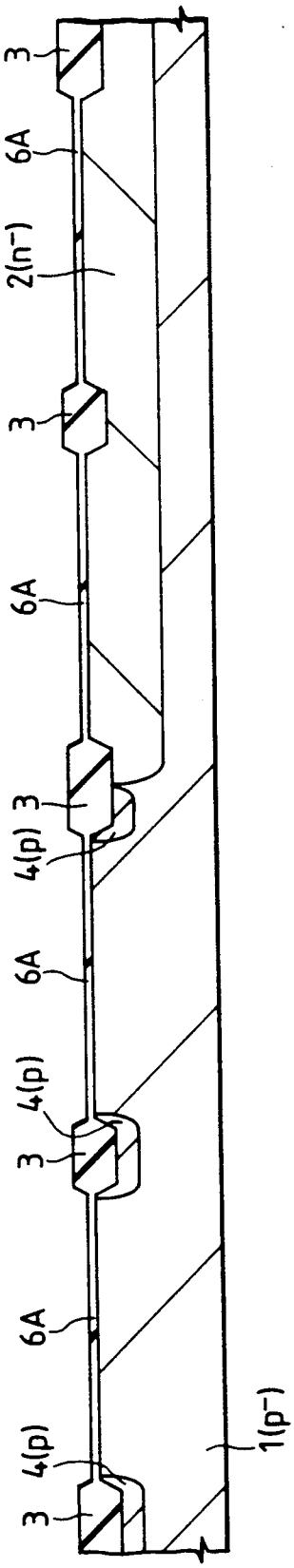
FIG. 2A
FIG. 2B

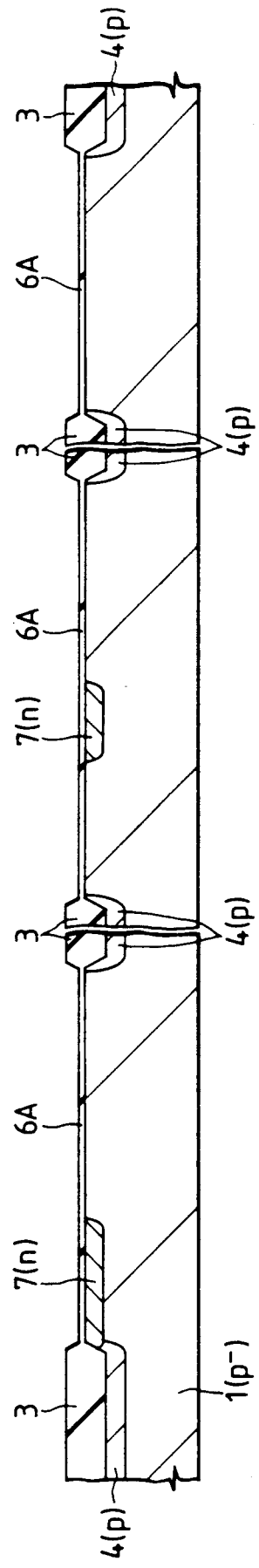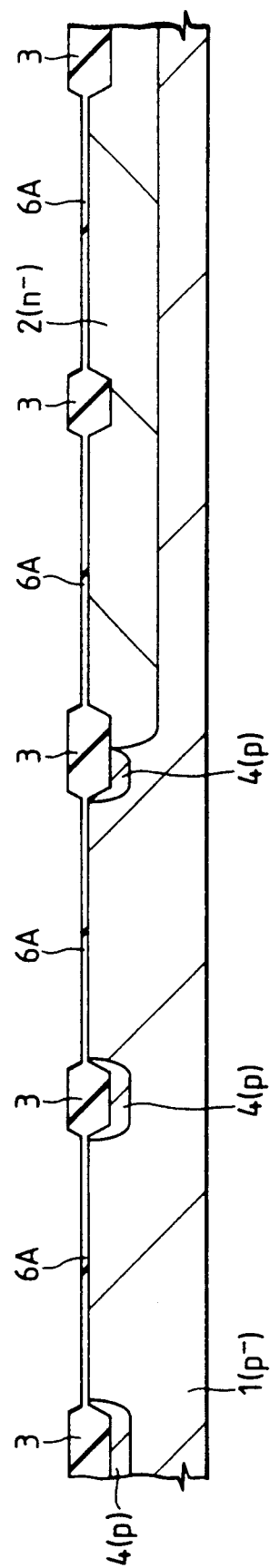

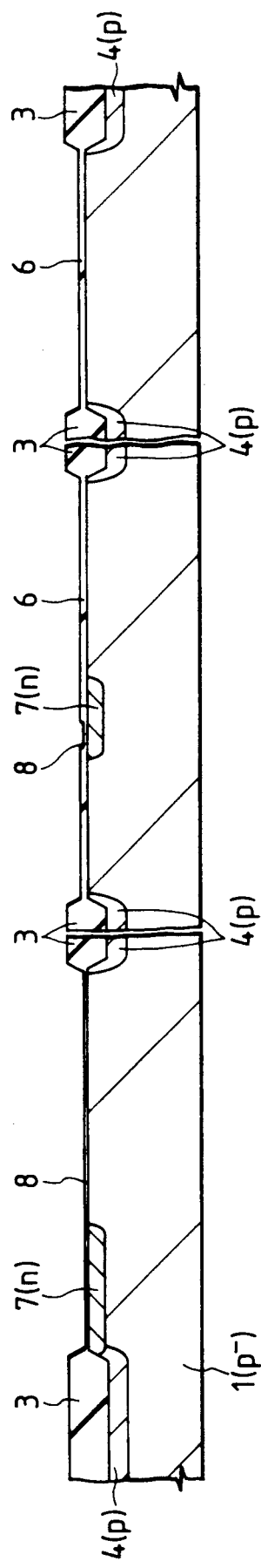
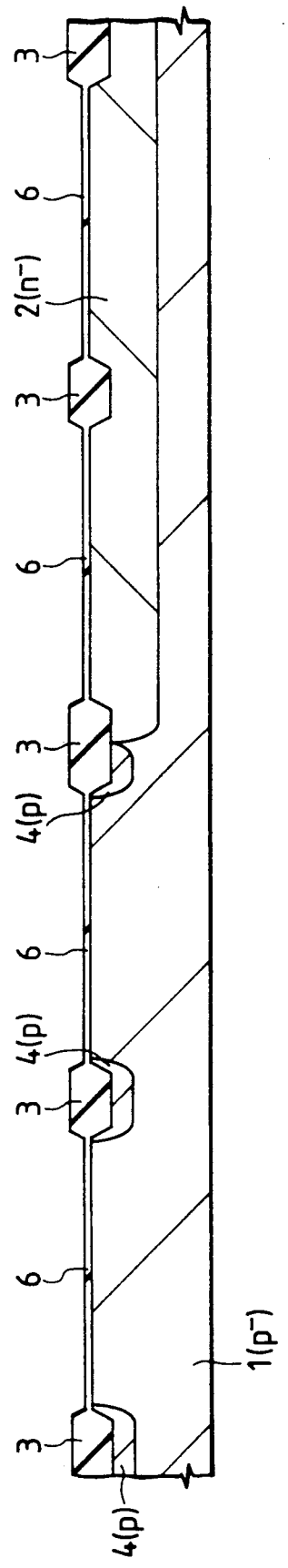

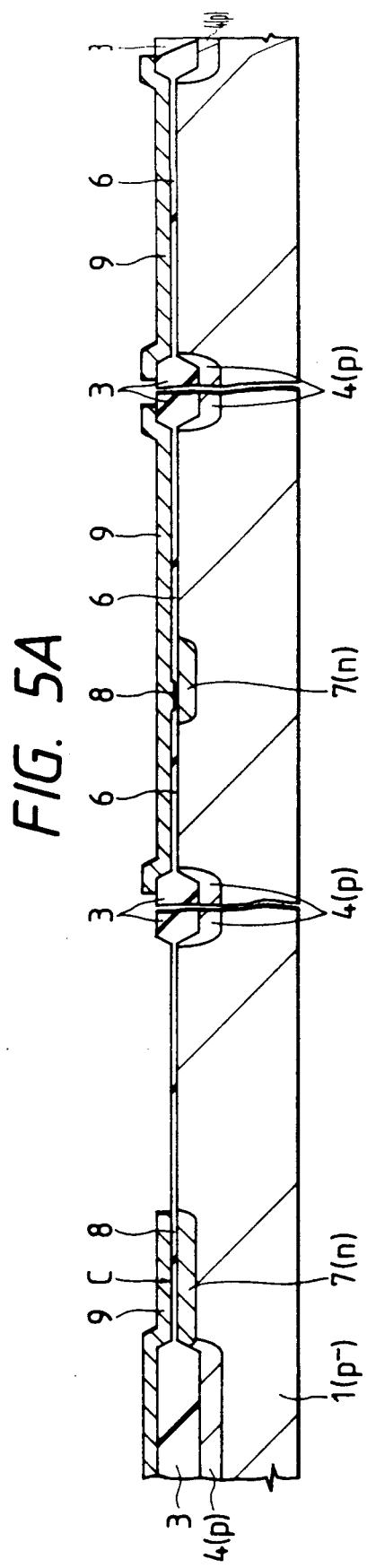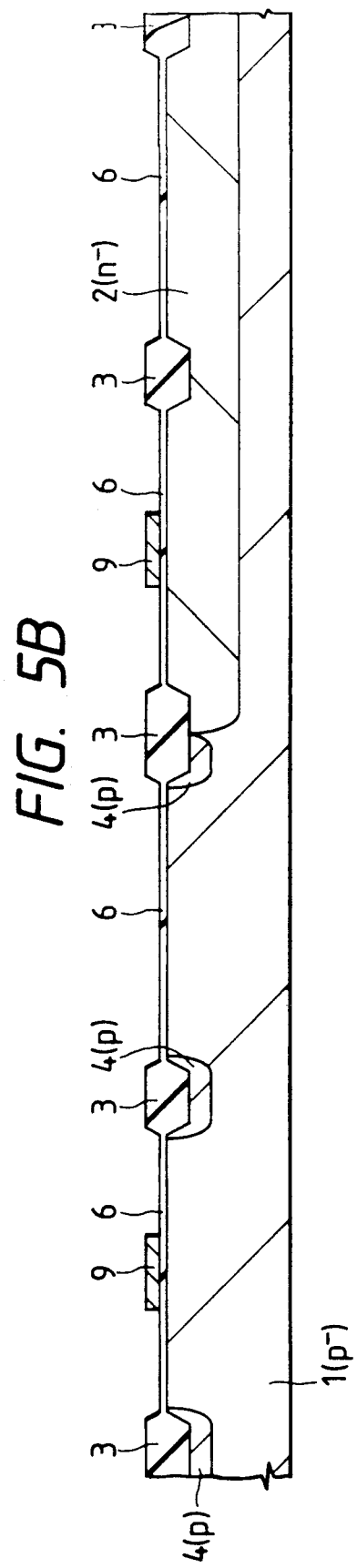

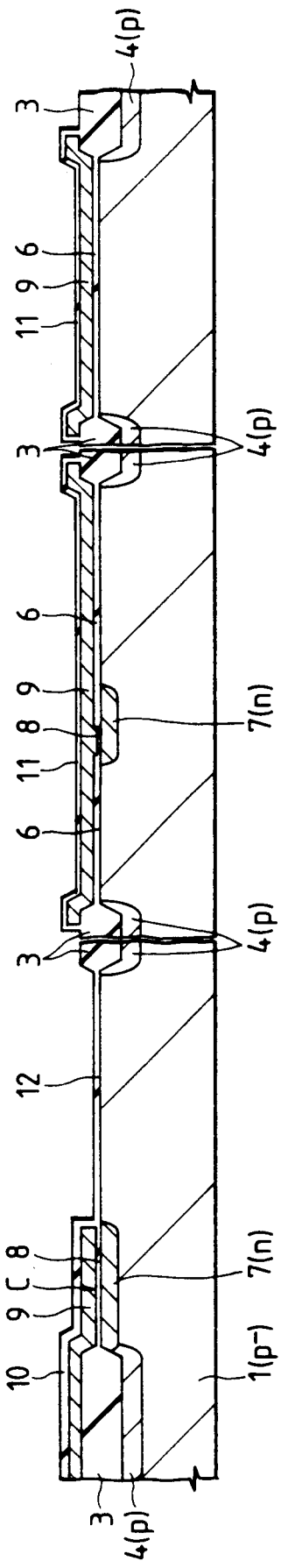
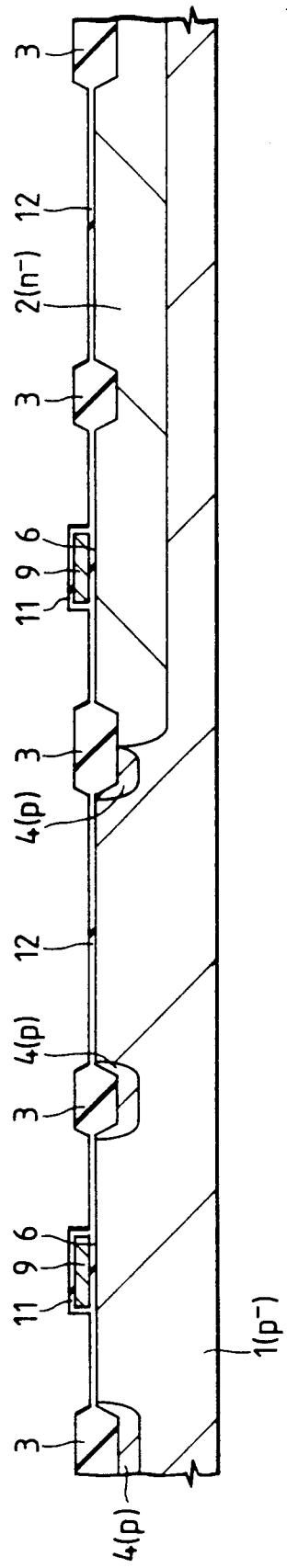
FIG. 6A
FIG. 6B

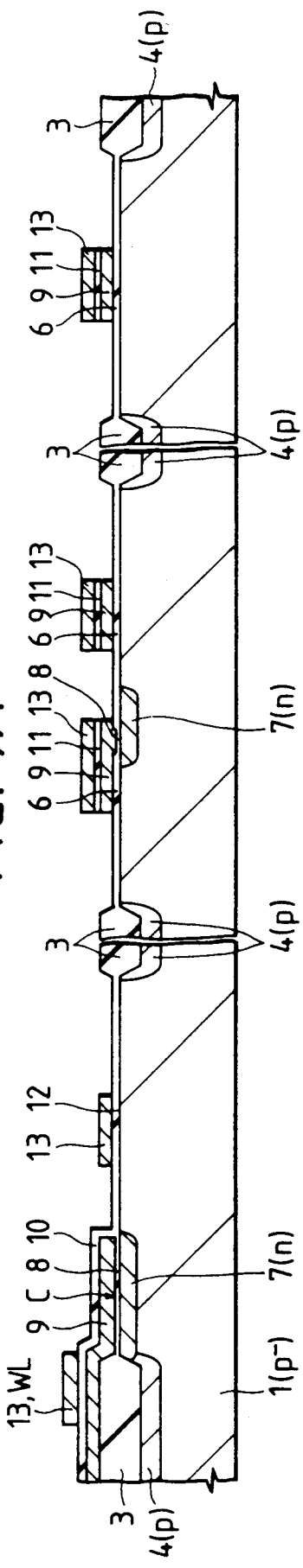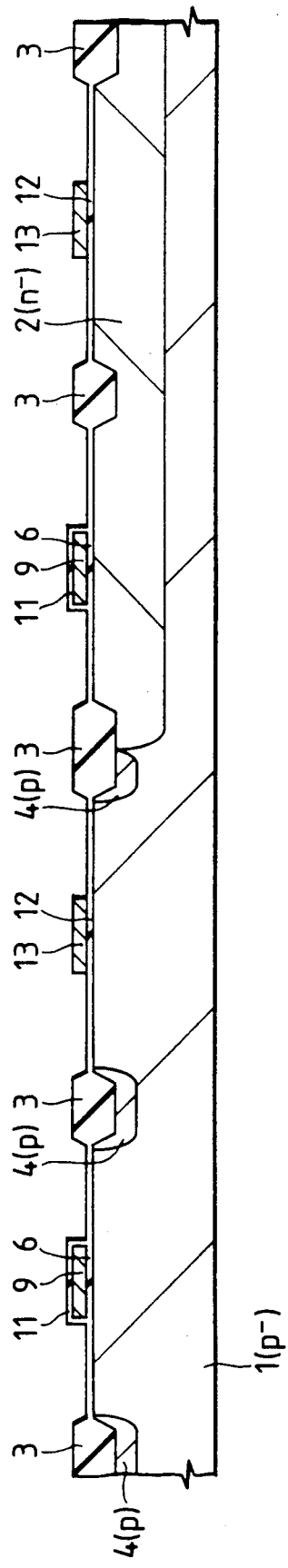

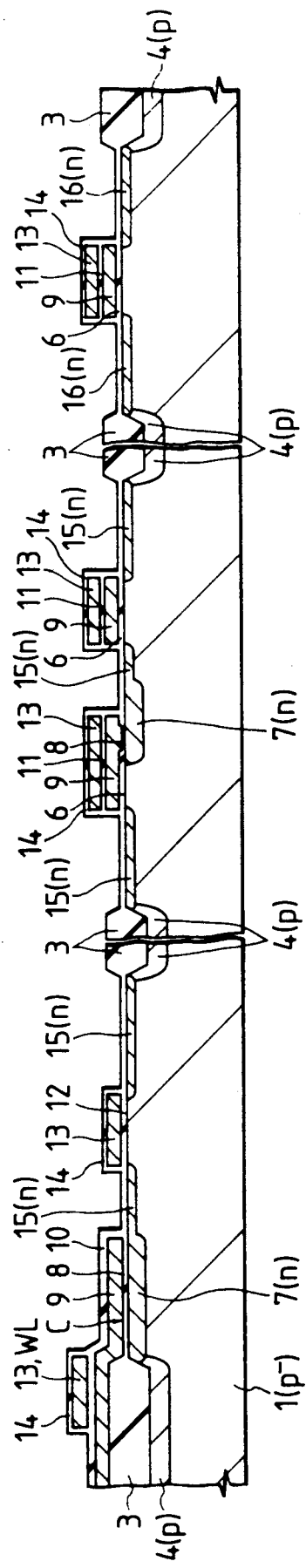
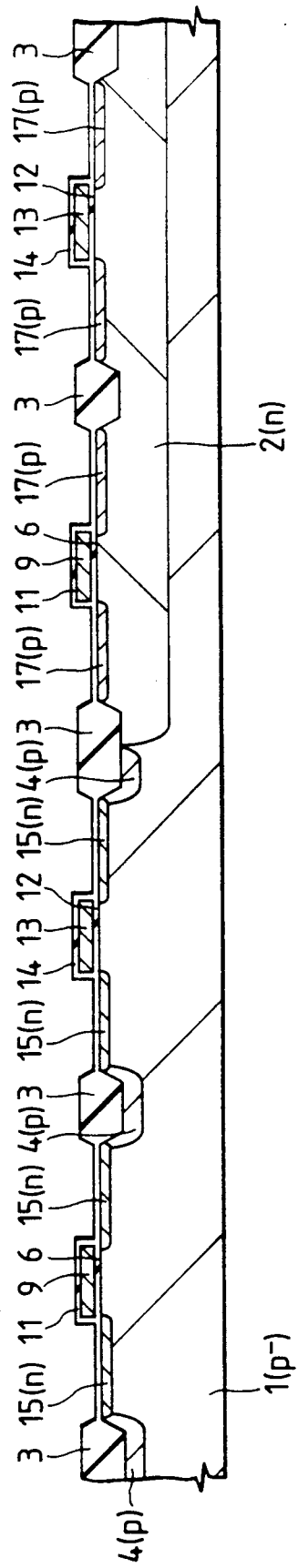

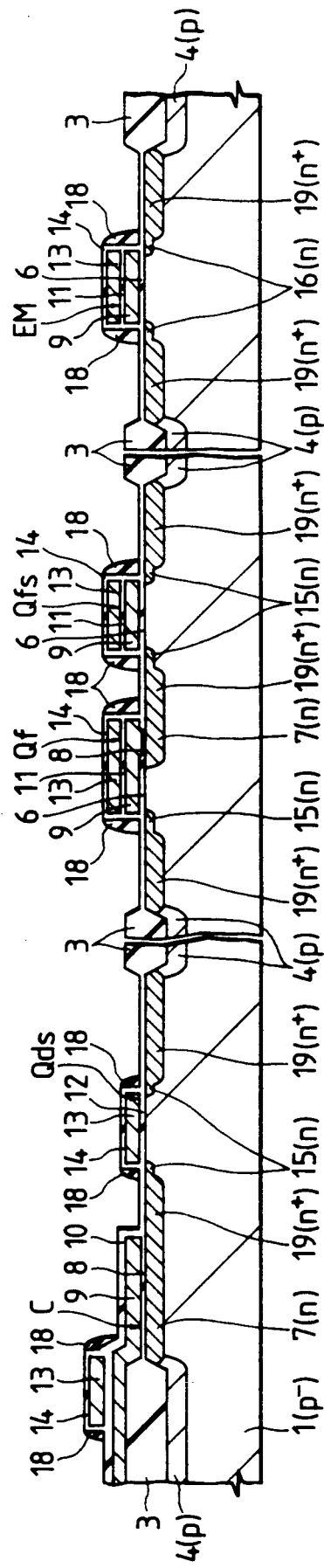
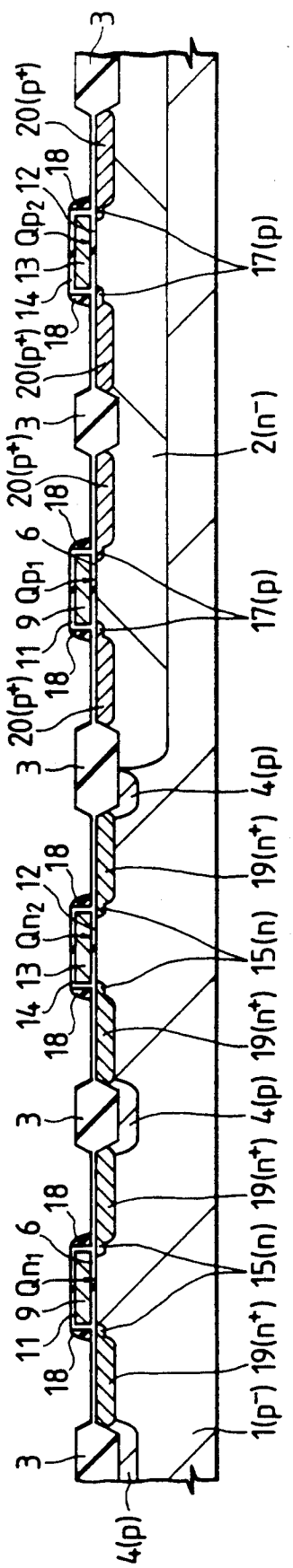
FIG. 9A
FIG. 9B

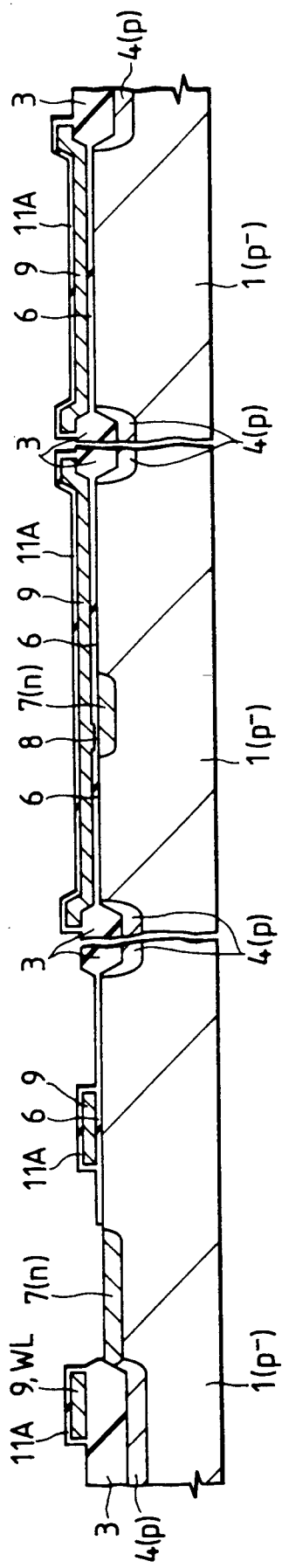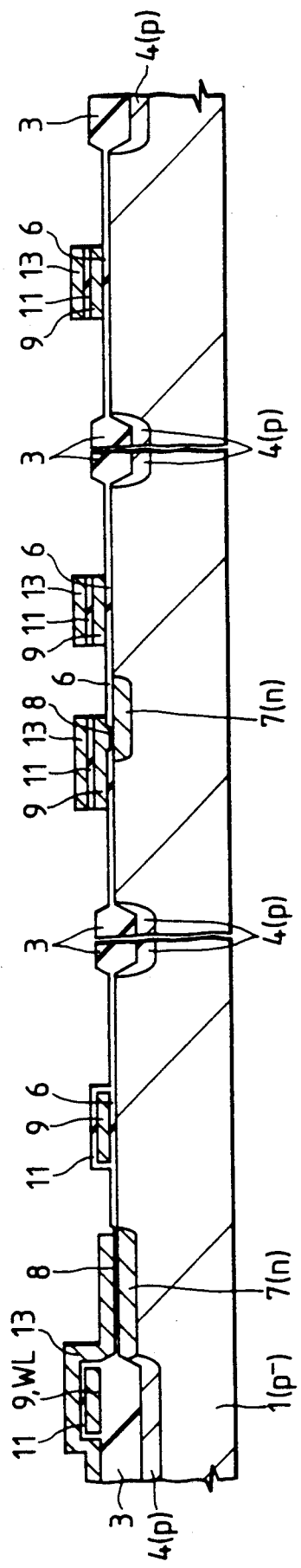

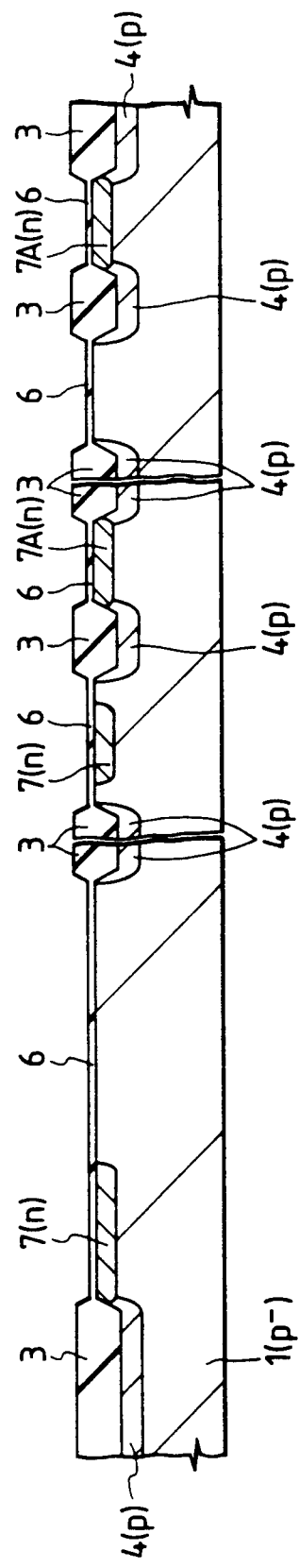
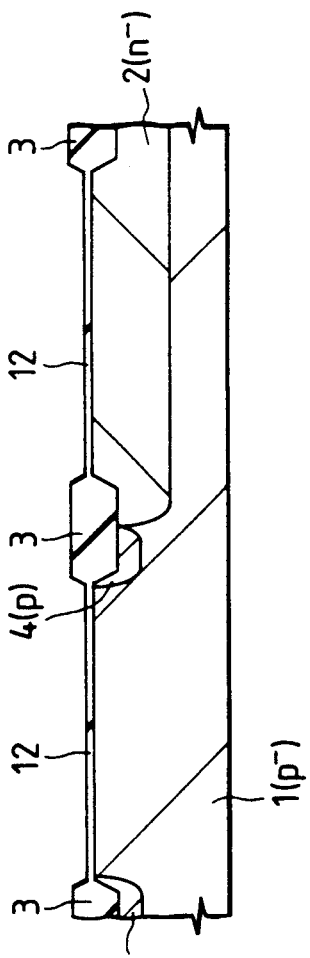
FIG. 15A
FIG. 15B

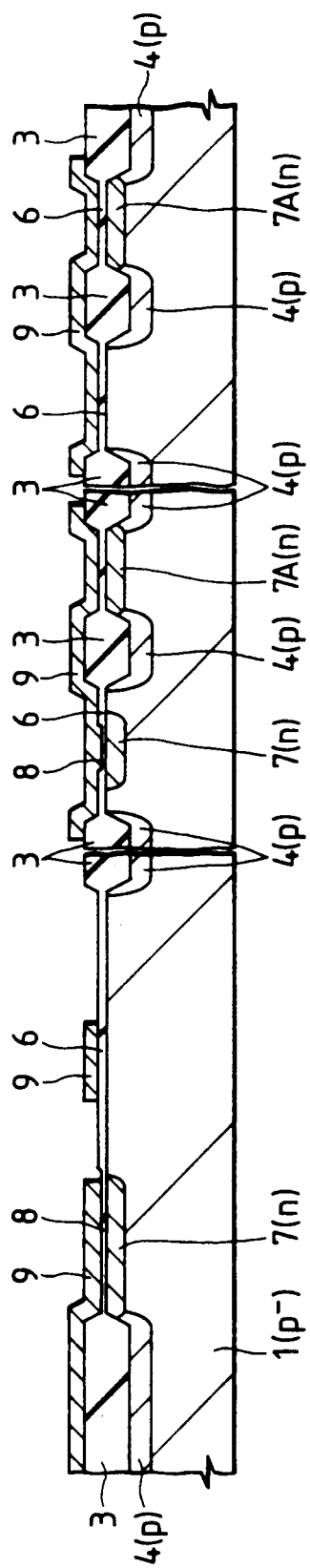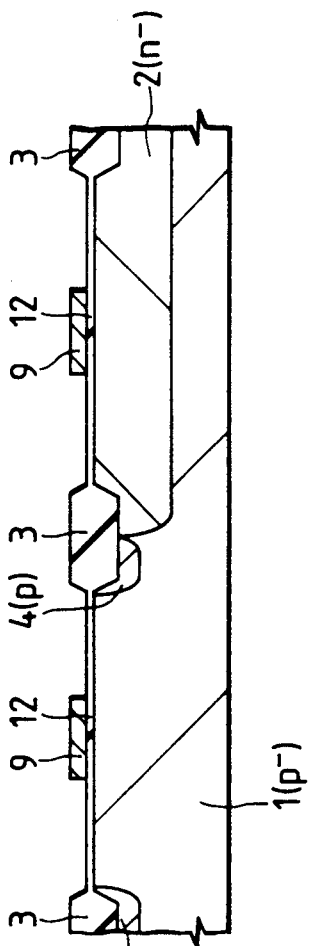
FIG. 16A
FIG. 16B

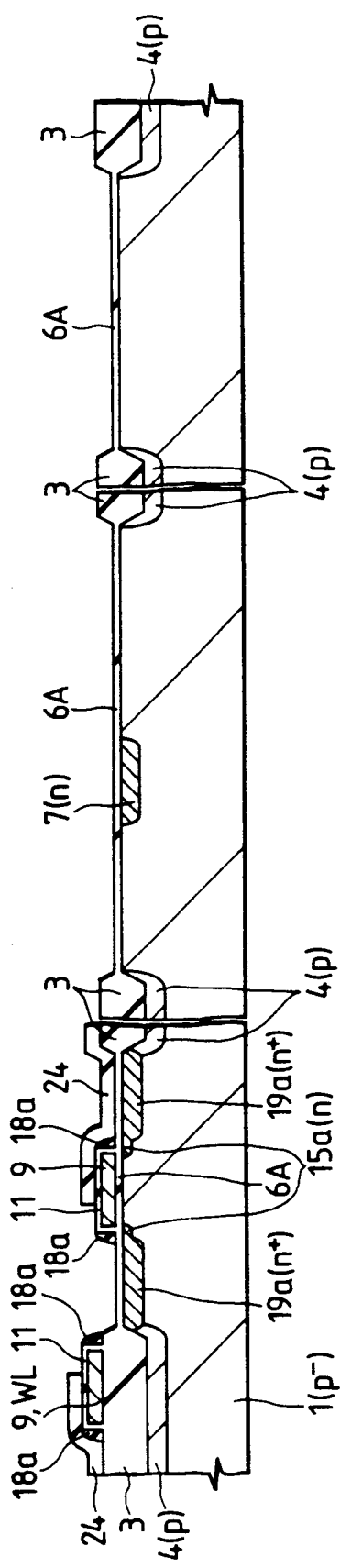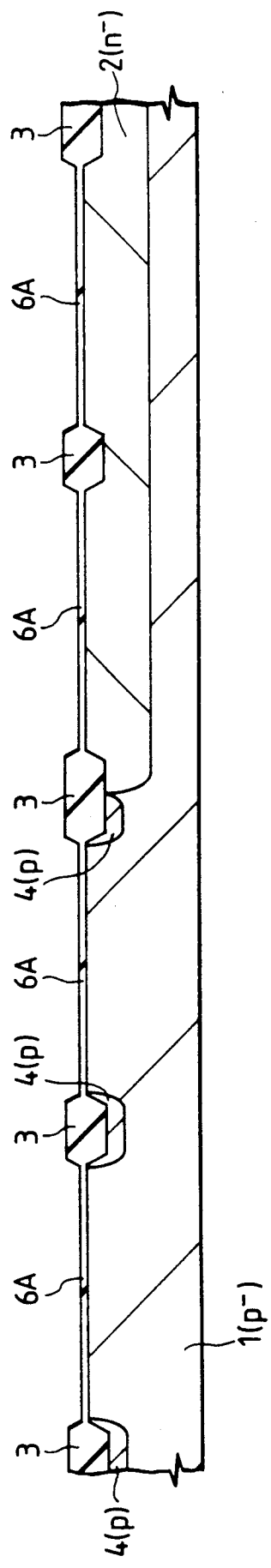

METHOD OF MAKING A SEMICONDUCTOR DEVICE HAVING DRAM CELLS AND FLOATING GATE MEMORY CELLS

BACKGROUND OF THE INVENTION

The present invention relates to a semiconductor integrated circuit device, and more particularly to effective technology to be applied to a semiconductor integrated circuit device having a dynamic type random access memory and a non-volatile memory.

A semiconductor integrated circuit device containing a microcomputer has a RAM (Random Access Memory) and a ROM (Read Only Memory) as a storage unit of the microcomputer. A S (Static) RAM is installed as a RAM, and its memory cell (storage element) is composed of six MOSFETs (six-MOS structure). A mask ROM, an EP (Erasable Programmable) ROM or an EEP (Electrically Erasable Programmable) ROM is installed as a ROM. A memory cell of FLOTOX (Floating Gate Tunnel Oxide) structure is used as an EEPROM.

In the semiconductor integrated circuit device of such constitution, since the memory cell of the SRAM used as a RAM is constituted in the six-MOS structure, the memory cell area is increased and the integration degree is decreased. Therefore, it has been proposed to use a D (Dynamic) RAM as a RAM of such semiconductor integrated circuit device in place of the SRAM. For example, refer to "Nikkei Microdevice" published by Nikkei MacGraw Hill on July 1987, pp 71–73. The DRAM in the proposed semiconductor integrated circuit device is composed of series circuit of a memory selecting MOSFET and an information storing capacitance element. The information storing capacitance element is composed of n type semiconductor region (lower electrode) formed on main surface portion of a semiconductor substrate, a dielectric film and a plate electrode (upper electrode) respectively stacked in sequence, i.e., in so-called planer structure.

In this semiconductor integrated circuit device, since the element number of the memory cell of the DRAM is little, it is characterized in that the memory cell area can be decreased and the integration degree can be improved.

Also in the semiconductor integrated circuit device, since the memory cell of the DRAM is formed utilizing a part of the manufacturing process of the FLOTOX structure of the EEPROM, it is characterized in that the manufacturing process can be reduced. In the semiconductor integrated circuit device as above described, the MISFET to constitute the DRAM, the EEPROM and the peripheral circuit is installed, and the manufacturing method of these elements is as follows.

First, in the floating gate electrode forming region of the memory cell of the FLOTOX structure of the EEPROM, a gate insulation film is formed on the main surface portion of the semiconductor substrate.

Second, a part of the gate insulation film is removed, and a tunnel silicon oxide film having film thickness less than that of the gate insulation film is formed.

Third, a floating gate electrode is formed on the gate insulation film and the tunnel silicon oxide film.

Fourth, a gate insulation film is formed on the floating gate electrode. Utilizing this process, according to the same manufacturing process as this process, a dielectric film (silicon oxide film) of the information storing capacitance element of the memory cell of the DRAM and a gate insulation film of the MISFET of the peripheral circuit are formed.

Fifth, a gate insulation film is interposed on the floating gate electrode of the memory cell of the FLOTOX structure, and a control gate electrode is formed. Utilizing this process, according to the same manufacturing process as this process, a plate electrode (upper electrode) is formed on the dielectric film of the information storing capacitance element of the memory cell of the DRAM and a gate electrode is formed on the gate insulation film of the MISFET of the peripheral circuit.

SUMMARY OF THE INVENTION

The dielectric film of the information storing capacitance element as above described is formed by the same manufacturing process as that of the gate isolation film between the floating gate electrode and the control gate electrode of the memory cell of the FLOTOX structure and the gate insulation film of the MISFET of the peripheral circuit. Since relatively high voltage required for write operation, read operation and erase operation of the information is applied to the control gate electrode of the memory cell of the FLOTOX structure, the gate insulation film below the control gate electrode cannot be formed by small film thickness. Also since the operation voltage of about 5(V) is usually applied to the gate electrode of the MISFET of the peripheral circuit, the gate insulation film below the gate electrode cannot be formed by small film thickness. Consequently, the dielectric film of the information storing capacitance element formed by the same manufacturing process as that of the gate insulation film is formed by large film thickness being substantially the same as that of the gate insulation film. Therefore, charge quantity stored in the information storing capacitance element of the memory cell of the DRAM is decreased, and in order to increase the charge quantity the occupation area of the information storing capacitance element is increased. As a result, since the occupation area of the RAM is increased, the integration degree of the semiconductor integrated circuit device is decreased.

Also in order to increase the charge quantity of the information storing capacitance element of the memory cell of the DRAM, the dielectric film must be formed by the manufacturing process being separate from that of the gate insulation film of the FLOTOX structure and the gate insulation film of the MISFET of the peripheral circuit. Consequently, in order to improve the integration degree, the manufacturing process of the semiconductor integrated circuit device is increased.

An object of the invention is to provide technology to enable the improvement of the integration degree in a semiconductor integrated circuit device having a dynamic type memory (DRAM) and a non-volatile memory.

Another object of the invention is to provide technology wherein area of a dynamic type memory element is decreased, and characteristics of a non-volatile memory element and an element in a peripheral circuit are optimized, thereby the foregoing object can be attained.

Another object of the invention is to provide technology wherein the manufacturing process of the semiconductor integrated circuit device can be reduced.

The foregoing and other objects and the novel features of the invention will be apparent from the description of the specification and the accompanying drawings.

Outline of the typical invention disclosed in the present application will be briefly described as follows.

In a semiconductor integrated circuit device having a dynamic type memory element, a non-volatile memory element of FLOTOX structure and a MISFET, a dielectric film of an information storing capacitance element of the dynamic type memory element and a tunnel insulation film of the non-volatile memory element are constituted by film thickness less than that of a gate insulation film of the MISFET.

Also in manufacturing method of a semiconductor integrated circuit device having a dynamic type memory element and a non-volatile memory element of FLOTOX structure, process of forming a dielectric film of an information storing capacitance element of the dynamic type memory element and process of forming a tunnel insulation film of the non-volatile memory element are performed in the same manufacturing process.

In manufacturing method of a semiconductor integrated circuit device having a dynamic type memory element and a non-volatile memory element of FLOTOX structure, a semiconductor region to form a lower electrode of an information storing capacitance element of the dynamic type memory element and a semiconductor region connected to a drain region of the non-volatile memory element are formed in the same manufacturing process, and then a dielectric film of the information storing capacitance element and a tunnel insulation film of the non-volatile memory element are formed in the same manufacturing process, and then further an upper electrode of the information storing capacitance element of the dynamic type memory element and a gate electrode of the non-volatile memory element are formed in the same manufacturing process.

In manufacturing method of a semiconductor integrated circuit device having a dynamic type memory element and a non-volatile memory element of FLOTOX structure, one electrode of an information storing capacitance element of the dynamic type memory element and a floating gate electrode of the non-volatile memory element are formed in the same manufacturing process, and then a dielectric film of the information storing capacitance element and a gate insulation film of the non-volatile memory element are formed in the same manufacturing process, and then further an upper electrode of the information storing capacitance element of the dynamic type memory element and a control gate electrode of the non-volatile memory element are formed in the same manufacturing process.

According to the above-mentioned means, since the charge storage quantity of the information storing capacitance element can be increased and the occupation area of the dynamic type memory element can be decreased, the integration degree can be improved and tunnel current quantity flowing through the tunnel insulation film can be increased. Consequently, the information write time of the non-volatile memory element can be decreased and the insulation withstanding voltage of the gate insulation film of the MISFET can be increased, thereby the electric reliability can be improved.

Since the tunnel insulation film can be formed in the process of forming the dielectric film, the manufacturing process of the semiconductor integrated circuit device can be reduced corresponding to the process of forming the tunnel insulation film.

In the process of forming the lower electrode, the dielectric film and the upper electrode of the information storing capacitance element, since the semiconductor region connected to the drain region of the non-volatile memory element, the tunnel insulation film and the gate electrode also can be formed, the manufacturing process of the semiconductor integrated circuit device can be reduced corresponding to the process of forming the semiconductor region, the tunnel insulation film and the gate electrode.

Also in the process of forming the lower electrode, the dielectric film and the upper electrode of the information storing capacitance element, since the floating gate electrode, the gate insulation film and the control gate electrode of the non-volatile memory element also can be formed, the manufacturing process of the semiconductor integrated circuit device can be reduced corresponding to the process of forming the floating gate electrode, the gate insulation film and the control gate electrode.

BRIEF DESCRIPTION OF THE DRAWINGS

FIGS. 1A and 1B are main part sectional views of a semiconductor integrated circuit device containing a microcomputer as Embodiment I of the invention;

FIGS. 2A and 2B through FIGS. 9A and 9B are main part sectional views of the semiconductor integrated circuit device of Embodiment I in each manufacturing process;

FIG. 11 through FIG. 13 are main part sectional views of the semiconductor integrated circuit device of Embodiment II in each manufacturing process;

FIGS. 15A and 15B and FIGS. 16A and 16B are main part sectional views of the semiconductor integrated circuit device of Embodiment III in each manufacturing process;

FIGS. 20A and 20B are main part sectional views of the semiconductor integrated circuit device of Embodiment V in a manufacturing process.

DETAILED DESCRIPTION OF THE INVENTION

Figure 10:
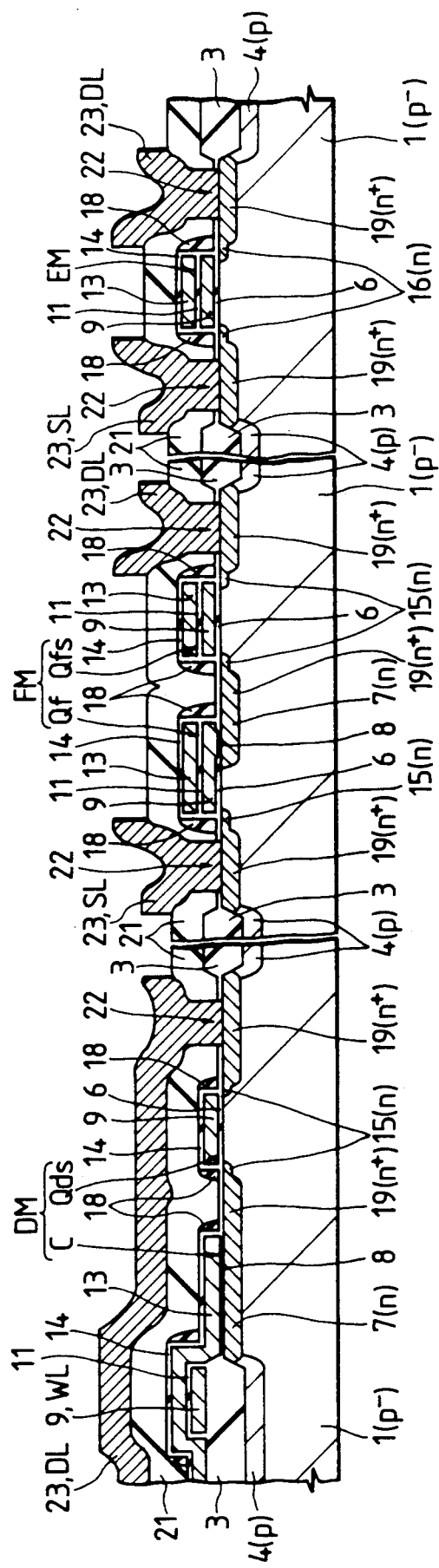
FIG. 10 is a main part sectional view of a semiconductor integrated circuit device containing a microcomputer as Embodiment II of the invention.

Constitution of the invention will now be described together with an embodiment where the invention is applied to a semiconductor integrated circuit device containing a microcomputer.

In all figures explaining the embodiment, those having the same function are designated by the same reference numerals, and the repeated description shall be omitted.

A semiconductor integrated circuit device containing a microcomputer as Embodiment I of the invention is shown in FIGS. 1A and 1B (main part sectional view showing each element).

As shown in FIGS. 1A and 1B, the semiconductor integrated circuit device is constituted by p- type semiconductor substrate 1 of one common monocrystalline silicon. That is, although the semiconductor substrate 1 is written in dividing in FIGS. 1A and 1B for convenience of the drawing, it is constituted integrally in actual state.

On the main surface of the semiconductor substrate 1, as shown in FIG. 1A, memory elements of a RAM and a ROM to constitute a memory unit of a microcomputer are constituted. The ROM is constituted by a DRAM, and its memory cell (dynamic type memory element) DM is installed. The ROM is composed of an EEPROM, an EPROM and a mask ROM, and a memory cell (non-volatile memory element) FM of the EEPROM of FLOTOX structure and a memory cell (non-volatile memory element) EM of the EPROM are installed respectively. Since a memory cell of the mask ROM is constituted in substantially the same structure as that of an element (n-channel MISFET) shown in FIG. 1B, it is not shown here and the description shall be omitted. Also on the main surface of other region of the semiconductor substrate 1, as shown in FIG. 1B, a complementary MISFET (CMOS) to constitute a peripheral circuit is formed. The CMOS is constituted by combination of n-channel MISFETs $Qn_1$, $Qn_2$, and p-channel MISFETs $Qp_1$, $Qp_2$ respectively. The p-channel MISFETs $Qp_1$, $Qp_2$ are constituted respectively on a main surface of n-type well region 2 provided on the main surface portion of the semiconductor substrate 1.

The semiconductor element constituted on the main surface of the semiconductor substrate 1 is separated electrically from other region by a field insulation film 3 and p type channel stopper region 4. The semiconductor element constituted on the main surface of the well region 2 is separated electrically from other region by the field insulation film 3. The field insulation film 3 is formed by a silicon oxide film where respective main surfaces of the semiconductor substrate 1 and the well region 2 are oxidized selectively. The channel stopper region 4 is constituted below the field insulation film 3 on a main surface portion of the semiconductor substrate 1.

The memory cell DM of the DRAM, as shown to the left side of FIG. 1A, is constituted by series circuit of a memory selecting MISFET Qds and an information storing capacitance element C.

The information storing capacitance element C is constituted by overlaying of n type doped semiconductor region (lower electrode) 7, a dielectric film 8 and a plate electrode (upper electrode) 9 in sequence. The information storing capacitance element C is constituted by so-called planar structure (MOS structure).

The semiconductor region 7 is constituted on the main surface portion of the semiconductor substrate 1.

The dielectric film 8 is formed by a silicon oxide film where the main surface of the semiconductor region 7 (semiconductor substrate 1) is oxidized. The dielectric film 8 is formed in film thickness being substantially the same as that of a tunnel insulation film (silicon oxide film) 8 of a memory cell FM of an EEPROM as hereinafter described, for example, in film thickness as small as about 100 (Å). The dielectric film 8 and the tunnel insulation film 8 are formed respectively in small film thickness in comparison to film thickness 250–500 Å of a gate insulation film 6 or 12 of the memory selecting MISFET Qds or the MISFETs $Qn_1$, $Qn_2$, $Qp_1$, $Qp_2$ of the peripheral circuit. That is, since the dielectric film 8 of the information storing capacitance element C is formed in small film thickness, the charge storage quantity of the information storing capacitance element C can be increased and the area of the memory cell DM can be decreased.

The plate electrode 9 is constituted on upper side of the dielectric film 8. The plate electrode 9 is formed by a polycrystalline silicon film in which, for example, impurity (P, As or B) to reduce the resistance value is introduced. The plate electrode 9 is formed in film thickness of about 3000–4000 (Å) for example. The plate electrode 9 is formed by gate electrode material of a first layer in the manufacturing process. An interlayer insulation film 10 (silicon oxide film) is provided on the surface of the plate electrode 9.

The memory cell selecting MISFET Qds is mainly composed of the semiconductor substrate 1, the gate insulation film 12, a gate electrode 13, a pair of n type semiconductor regions 15 and a pair of n+ type semiconductor regions 19 being source region and drain region. That is, the memory cell selecting MISFET Qds is constituted by the n-channel MISFET.

The semiconductor substrate 1 is used as a channel forming region.

The gate insulation film 12 is formed by a silicon oxide film where the main surface portion of the semiconductor substrate 1 is oxidized. The gate insulation film 12 is formed in large film thickness in comparison to that of the dielectric film 8 of the information storing capacitance element C as above described, for example, in film thickness of about 250 (Å). That is, the gate insulation film 12 is constituted so as to secure the insulation withstanding voltage between the semiconductor substrate 1 and the gate electrode 13 in the usual operation range (for example, voltage between the semiconductor substrate 1 and the gate electrode 13 being 5(V)).

The gate electrode 13 is formed on upper side of the gate insulation film 12. The gate electrode 13 is formed by a polycrystalline silicon film in which, for example, impurity to reduce the resistance value is introduced. The gate electrode 13 is formed in film thickness of about 3000–4000 (Å) for example. The gate electrode 13 is formed by gate electrode material of a second layer in the manufacturing process. In order to reduce the resistance value, the gate electrode 13 may be formed by a high melting point metal film (Mo, W, Ta or Ti) or a high melting point metal silicide film (MoSi2, WSi2, TaSi2 or TiSi2) in a single layer, or a composite film where the high melting point metal film or the high melting point metal silicide film is provided on the polycrystalline silicon film. Also the gate electrode 13 is constituted with a word line (WL) 13.

The n type semiconductor region 15 of low impurity density is provided between the n+type semiconductor region 19 of high impurity density and the channel forming region. The n type semiconductor region 15 constitutes a MISFET of so-called LDD (Lightly Doped Drain) structure. The n type semiconductor region 15 is constituted in self-alignment to the gate electrode 13. The n+ type semiconductor region 19 of high impurity density is constituted in self-alignment to the gate electrode 13 in interposing of a side wall spacer 18.

One n+ type semiconductor region 19 of the memory cell selecting MISFET Qds is interconnected with the semiconductor region 7 being a lower electrode of the information storing capacitance element C. An another n+ type semiconductor region 19 of the memory cell selecting MISFET Qds is connected a wiring 23 through via a connecting hole 22 formed on an interlayer insulation film 21. The wiring 23 is used as a complementary data line (DL). The wiring 23 is formed, for example, by aluminum or aluminum alloy to which Si and/or Cu is added. Si reduces the alloy spike phenomenon, and Cu reduces the stress migration.

The memory cell FM of the EEPROM, as shown in center portion of FIG. 1A, is constituted by series circuit of a field effect transistor Qf of FLOTOX structure and a memory cell selecting MISFET Qfs. That is, the memory cell FM of the EEPROM is constituted by two-transistor structure.

The field effect transistor Qf is constituted so as to have information "1" or "0". The field effect transistor Qf is mainly composed of the semiconductor substrate 1, the semiconductor region 7, a gate insulation film 6, a tunnel insulation film 8, a floating gate electrode 9, a gate insulation film 11, a control gate electrode 13, a pair of n type semiconductor regions 15 and a pair of n+type semiconductor regions 19 being source region and drain region.

The semiconductor substrate 1 is used as a channel forming region.

The semiconductor region 7 is connected integrally with the n+ type semiconductor region 19 used as the drain region, and extended to the main surface portion of the semiconductor substrate 1 below the tunnel insulation film 8.

The gate insulation film 6 is formed by a silicon oxide film where the main surface of the semiconductor substrate 1 is oxidized. The gate insulation film 6 is formed in large film thickness in comparison to that of the dielectric film 8 of the information storing capacitance element C, for example, in film thickness of about 500 (Å). That is, the gate insulation film 6 is constituted so as to secure the in insulation withstanding voltage between the semiconductor region 7 and the floating gate electrode 13 in the usual range of the information write operation and erase operation (for example, voltage between the semiconductor region 7 and the control gate electrode 9 being 17-20(V)).

The tunnel insulation film 8 is formed by a silicon oxide film where a part of the gate insulation film 6 below the floating gate electrode 9 is removed by etching, and the main surface of the semiconductor substrate 1 in the removed portion is oxidized. The tunnel insulation film 8 is formed in small film thickness similar to that of the dielectric film 8, for example, in film thickness of about 100 (Å). Since the tunnel insulation film 8 in such small film thickness can increase the tunnel current quantity per unit area, the time required for the information write operation and erase operation of the memory cell FM can be decreased.

The floating gate electrode 9 is constituted by gate electrode material of a first layer similar to the plate electrode 9 of the information storing capacitance element C.

The gate insulation film 11 is formed by a silicon oxide film where the surface of the floating gate electrode 9 is oxidized. The gate insulation film 11 is constituted so as to secure the insulation withstanding voltage between the floating gate electrode 9 and the control gate electrode 13 in the information write operation, read operation and erase operation. The gate insulation film 11 is formed in relatively large film thickness, for example, about 300-400 (Å).

The control gate electrode 13 is provided on the gate insulation film 11. The control gate electrode 13 is constituted by gate electrode material of a second layer similar to the gate electrode 13 of the memory cell selecting MISFET Qds of the memory cell DM of the DRAM.

The field effect transistor Qf is constituted by the LDD structure.

The memory cell selecting MISFET Qfs is basically composed of the semiconductor substrate 1, a gate insulation film 6, a gate electrode 9, a pair of n type semiconductor regions 15 and a pair of n+ type semiconductor regions 19 being source region and drain region.

The gate insulation film 6 and the gate electrode 9 are constituted respectively by substantially the same manufacturing process as that of the field effect transistor Qf. The memory cell selecting MISFET Qfs is constituted by the LDD structure. The n+ type semiconductor region 19 being the source region of the memory cell selecting MISFET Qfs is connected integrally with the n+ type semiconductor region 19 being the drain region of the field effect transistor Qf.

On the gate electrode 9 of the memory cell selecting MISFET Qfs is provided a shunt wiring 13 in interposing an interlayer insulation film 11. The shunt wiring 13 is connected to the gate electrode 9 through via a connecting hole (not shown) formed on the interlayer insulation film 11 per the memory cell selecting MISFET Qfs or per prescribed number in the extending direction of the word line. That is, the shunt wiring 13 can reduce the resistance value of the gate electrode 9 of the memory cell selecting MISFET Qfs and the word line connected integrally therewith. Also the memory cell selecting MISFET Qfs is constituted by two-layer gate structure comprising the gate electrode 9 and the shunt wiring 13 similar to the field effect transistor Qf. If the field effect transistor Qf and the memory cell selecting MISFET Qfs are constituted respectively by two-layer gate structure as above described, intergate dimension of both transistors can be defined only by the processing dimension without necessitating the mask alignment margin dimension in the manufacturing process. That is, distance between the field effect transistor Qf and the memory cell selecting MISFET Qfs can be decreased and the occupation area of the memory cell FM of the EEPROM can be decreased. A wiring 23 is connected through via a connecting hole 22 to the n+ type semiconductor region 19 being the source region of the field effect transistor Qf of the memory cell FM of the EEPROM. The wiring 23 is used as a source wiring (SL). A wiring 23 is connected through via a connecting hole 22 to the n+ type semiconductor region 19 being the drain region of the memory cell selecting MISFET Qfs of the memory cell FM of the EEPROM. The wiring 23 is used as a data line (DL).

The memory cell EM of the EPROM, as shown to the right side of FIG. 1A, is constituted by a field effect transistor. The memory cell EM of the EPROM is mainly composed of the semiconductor substrate 1, a gate insulation film 6, a floating gate electrode 9, a gate insulation film 11, a control gate electrode 13, a pair of n type semiconductor regions 16 and a pair of n+ type semiconductor regions 19 being source region and drain region.

The memory cell EM of the EPROM is constituted by the two-layer gate structure and the LDD structure similar to the field effect transistor Qf of the memory cell FM of the EEPROM. The n type semiconductor region 16 of low impurity density of the field effect transistor being the memory cell EM of the EPROM is constituted in high impurity density in comparison to that of the n type semiconductor region 15 in low impurity density of the MISFETs Ods, Of, Ofs or the like of the LDD structure. Also the n type semiconductor region 16 is constituted in low impurity density in comparison to the n+ type semiconductor region 19 in high impurity density of other MISFETs Qds, Qf, Qfs or the like. The n type semiconductor region 16 is constituted so as to raise the electric field intensity in the vicinity of the drain region of the field effect transistor and to increase the generating quantity of the hot carriers. That is, the n type semiconductor region 16 is constituted so that the generating quantity of hot electrons implanted to the floating gate electrode 9 of the memory cell EM of the EPROM can be increased and the write operation time of information can be decreased. Also the n type semiconductor region 16 is constituted so that the resistance value of the source region and the drain region in the vicinity of the channel forming region can be reduced and the transfer conductance can be reduced and the information read time can be decreased.

A wiring 23 is connected through via a connecting hole 22 to the n+type semiconductor region 19 being the source region of the field effect transistor as the memory cell EM of the EPROM. The wiring 23 is used as a source wiring (SL). A wiring 23 is connected through via a connecting hole 22 to the n+ type semiconductor region 19 being the drain region of the field effect transistor. The wiring 23 is used as a data line (DL).

The CMOS of the peripheral circuit, i.e., n-channel MISFETs $Qn_1$, $Qn_2$ and p-channel MISFETs $Qp_1$, $Qp_2$ are constituted respectively as shown in FIG. 1B.

The n-channel MISFET $Qn_1$ is composed of the semiconductor substrate 1, a gate insulation film 6, a gate electrode 9, a pair of n type semiconductor regions 15 and a pair of n+ type semiconductor regions 19 being source region and drain region.

The n-channel MISFET $Qn_2$ is composed of the semiconductor substrate 1, a gate insulation film 12, a gate electrode 13, a pair of n type semiconductor regions 15 and a pair of n+ type semiconductor regions 19 being source region and drain region.

The p-channel MISFET $Qp_1$ is composed of a well region 2, a gate insulation film 6, a gate electrode 9, a pair of p type semiconductor regions 17 and a pair of p+ type semiconductor regions 20 being source region and drain region.

The p-channel MISFET $Qp_2$ is composed of a well region 2, a gate insulation film 12, a gate electrode 13, a pair of p type semiconductor regions 17 and a pair of p+ type semiconductor regions 20 being source region and drain region.

The n-channel MISFET Qnl and the p-channel MISFET $Qp_1$ are formed in the gate insulation film 6 and the gate electrode 9 thereof respectively in the same manufacturing process as that of the gate insulation film 6 and the floating gate electrode 9 of the field effect transistor Qf or the like of the memory cell FM. That is, the n-channel MISFET Qnl and the p-channel MISFET $Qp_1$ are formed in the gate electrode 9 thereof respectively by gate electrode material in a first layer.

On the other hand, the n-channel MISFET $Qn_2$ and the p-channel MISFET $Qp_2$ are formed in the gate insulation film 12 and the gate electrode 13 thereof respectively in the same manufacturing process as that of the gate insulation film 12 and the gate electrode 13 of the memory cell selecting MISFET Qds of the memory cell DM. That is, the n-channel MISFET $Qn_2$ and the p-channel MISFET $Qp_2$ are formed in the gate electrode 13 thereof respectively by gate electrode material in a second layer.

The MISFETs $Qn_1$, $Qn_2$, $Qp_1$, $Qp_2$ are constituted by the LDD structure respectively. A wiring 23 is connected to respective n+ type semiconductor regions 19 of the n-channel MISFETs $Qn_1$, $Qn_2$. A wiring 23 is connected to respective p+ type semiconductor regions 20 of the p-channel MISFETs $Qp_1$, $Qp_2$.

Although not shown, a final passivation film is connected on the semiconductor element in such constitution.

In the semiconductor integrated circuit device having the memory cell DM (dynamic type memory element) of the DRAM, the memory cell FM (non-volatile memory element) of FLOTOX structure and the MISFETs ($Qn_1$, $Qn_2$, $Qp_1$, $Qp_2$) of the peripheral circuit, since the dielectric film 8 of the information storing capacitance element C of the memory cell DM and the tunnel insulation film 8 of the field effect transistor Qf of the memory cell FM are constituted in film thickness less than that of the gate insulation film 6 or 12 of the MISFET, the charge storage quantity of the information storing capacitance element C can be increased and the occupation area of the memory cell DM can be decreased. Consequently, the integration degree of the DRAM can be improved and the tunnel current quantity flowing through the tunnel insulation film 8 can be increased thereby the information write time of the memory cell FM of the EEPROM can be decreased, and the insulation withstanding voltage of the gate insulation film 6 or 12 of the MISFET can be increased thereby the electric reliability can be improved.

Next, the manufacturing method of the semiconductor integrated circuit device will be briefly described using FIGS. 2A and 2B through FIGS. 9A and 9B (main part sectional view in each manufacturing process).

First, p⁻ type semiconductor substrate 1 of monocrystalline silicon is prepared. Suitable doping density of the semiconductor substrate 1 is about $10^{15}$ (cm⁻³).

Next, in the forming region of the p-channel MISFETs $Qp_1$ and $Qp_2$ of the CMOS of the peripheral circuit, n⁻ type well region 2 is formed on the main surface portion of the semiconductor substrate 1. The n⁻ type well region 2 is formed in that P of about $10^{12}$ (atoms/cm²) for example is introduced by ion implantation in energy of about 125 (keV). Also p⁻ type well region may be formed on the whole region of the main surface portion of the semiconductor surface 1 other than the n⁻ type well region 2 or on the forming region of the n-channel MISFETs $Qn_1$ and $Qn_2$ of the CMOS of the peripheral circuit.

A field insulation film 3 is formed on respective main surfaces of the semiconductor substrate 1 and the well region 2 between the semiconductor element forming regions. The field insulation film 3 is formed by a silicon oxide film where respective main surfaces of the semiconductor substrate 1 and the well region 2 is selectively oxidized by thermal oxidation or the like. This is LOCOS Local Oxidation of Silicon process for example. According to substantially the same process as the process of forming the field insulation film 3, p type channel stopper region 4 is formed below the field insulation film 3 of the main surface portion of the semiconductor substrate 1. The p type channel stopper region 4 is formed in that $BF_2$ of about $10^{13}$ (atoms/cm$^2$) for example is introduced by ion implantation in energy of about 60 (keV).

As shown in FIGS. 2A and 2B, in the semiconductor element forming region, a gate insulation film 6A of about 400–490 (Å) is formed on respective main surfaces of the semiconductor substrate 1 and the well region 2. The gate insulation film 6A is used as a part of the gate insulation film of the field effect transistor or the MISFET. The gate insulation film 6A is formed by a silicon oxide film where respective main surfaces of the semiconductor substrate 1 and the well region 2 are oxidized by thermal oxidation or other known method.

As shown in FIGS. 3A and 3B, in the forming region of the information storing capacitance element C of the memory cell DM of the DRAM and the forming region of the field effect transistor Qf of the memory cell FM of the EEPROM, a semiconductor region 7 is formed on the main surface portion of the semiconductor substrate 1 in the same manufacturing process. The semiconductor region 7 forms a lower electrode (one electrode) in the forming region of the information storing capacitance element C. Also the semiconductor region 7 is formed so that the tunnel current flows between the drain region 19 and the floating gate electrode 9 in the forming region of the field effect transistor Qf. The semiconductor region 7 is formed in that the n type impurity, for example, As or P is introduced through the gate insulation film 6A to the main surface portion of the semiconductor substrate 1. The semiconductor region 7 is formed in that As of about $10^{15}$ (atoms/cm$^2$) for example is introduced only by ion implantation in energy of about 60–100 (keV). In introducing the n type impurity, a photoresist film (not shown) is used as an introducing mask.

Next, in the forming region of the information storing capacitance element C of the memory cell DM of the DRAM and the forming region of the field effect transistor Qf of the memory cell FM of the EEPROM, the gate insulation film 6A is selectively removed using known dry etching technology. Then in the forming region of the field effect transistor Qf a part of the gate insulation film 6A below the forming region of the floating gate electrode 9 is removed.

As shown in FIGS. 4A and 4B, in the region removing the gate insulation film 6A, the dielectric film 8 and the tunnel insulation film 8 are formed about 100 (Å) in the same manufacturing process on the main surface portion of the semiconductor substrate 1 (the semiconductor region 7 in the actual state). The dielectric film 8 is formed on the main surface of the semiconductor region 7 of the information storing capacitance element C forming region. The tunnel insulation film 8 is formed on the main surface of the semiconductor region 7 of the field effect transistor Qf forming region. The dielectric film 8 and the tunnel insulation film 8 are formed respectively by a silicon oxide film where the main surface of the semiconductor region 7 is oxidized by thermal oxidation or other known method, and in small film thickness as above described. According to the process of forming the dielectric film 8 and the tunnel insulation film 8, the gate insulation film 6A is grown about 500 (Å) as shown in FIGS. 4A and 4B thereby the gate insulation film 6 is formed. Since the film thickness of the dielectric film 8 (tunnel insulation film 8) is added to the gate insulation film 6A, the gate insulation film 6 is formed in large film thickness as above described.

The gate electrode layer 9 of the first layer is deposited about 3000–4000 (Å) on the whole surface of the substrate including the dielectric film 8, the tunnel insulation film 8 and the gate insulation film 6. The gate electrode layer 9 of the first layer is formed by the polycrystalline silicon film deposited by CVD (Chemical Vapor Deposition) for example. To the polycrystalline silicon film is introduced the n type impurity, for example, P so as to reduce the resistance value after the depositing. The n type impurity is formed in that P of about $10^{15}$–16 (atoms/cm$^2$) for example is introduced by ion implantation in energy of about 30 (keV). The n type impurity may be introduced not only by the ion implantation but also by the thermal diffusion.

Next, prescribed patterning is applied to the gate electrode layer 9 of the first layer, and as shown in FIGS. 5A and 5B, the plate electrode 9, the floating gate electrode 9 and the gate electrode 9 are formed respectively in the same manufacturing process. The patterning is performed, for example, using anisotropic etching of RIE (Reactive Ion Etching) or the like. The plate electrode 9 is formed on the dielectric film 8 in the information storing capacitance element C forming region of the memory cell DM of the DRAM. The floating gate electrode 9 is formed on the tunnel insulation film 8 and the gate insulation film 6 of the field effect transistor Qf forming region of the EEPROM, and on the gate insulation film 6 of the field effect transistor forming region of the EPROM respectively. Respective floating gate electrodes 9 ar patterned only in the gate width direction. The gate electrode 9 is formed on respective gate insulation films 6 of the n-channel MISFET $Qn_1$ forming region and the p-channel MISFET $Qp_1$ forming region of the CMOS. According to the process of forming the plate electrode 9, the information storing capacitance element C of the memory cell DM of the DRAM is completed where the semiconductor region (lower electrode) 7, the dielectric film 8 and the plate electrode (upper electrode) 9 are respectively overlaid in sequence.

An insulation film to cover the upper side of the plate electrode 9, the floating gate electrode 9 and the gate electrode 9 is formed about 2000 (Å). The insulation film is formed by a silicon oxide film where respective surfaces of the plate electrode 9, the floating gate electrode 9 and the gate electrode 9 are oxidized by the thermal oxidation or other known method.

While the insulation film on the plate electrode 9 10 remains, the insulation film on the floating gate electrode 9 and also the gate insulation film 6 in the region without forming the gate electrode layer 9 in the first layer are selectively removed using the known dry etching technology.

Oxidation processing is applied to the whole surface of the substrate by the thermal oxidation or other known method, and as shown in FIGS. 6A and 6B, an interlayer insulation film 10 is formed on the surface of the plate electrode 9, and a gate insulation film 11 is formed on the surface of the floating gate electrode 9, and an insulation film 11 is formed on the surface of the gate electrode 9, and further a gate insulation film 12 is formed on the main surface of the semiconductor substrate 1 and the well region 2. The interlayer insulation film 10, the gate insulation film 11, the insulation film 11 and the gate insulation film 12 respectively are formed in the same manufacturing process. The interlayer insulation film 10 is formed in large film thickness, for example, about 2000-3000 (Å). The gate insulation film 11 and the insulation film 11 are formed in film thickness about 300-400 (Å). The gate insulation film 12 is formed in film thickness about 250 (Å) for example. Since the interlayer insulation film 10 on the surface of plate electrode 9 insulates the plate electrode 9 and the word line 13 extending on the upper layer thereof, the interlayer insulation film 10 is preferably thick but may be formed in small film thickness similar to the gate insulation film 11 so as to reduce the manufacturing process.

A gate electrode layer 13 in a second layer is deposited about 3000-4000 (Å) on the whole surface of the substrate including the interlayer insulation film 10, the gate insulation film 11, the insulation film 11 and the gate insulation film 12. The gate electrode layer 13 in the second layer is formed by a polycrystalline silicon film deposited by CVD for example. To the polycrystalline silicon film is introduced the n type impurity similar to the gate electrode layer 9 in the first layer. The n type impurity is formed in that p of about $10^{16}$ (atoms/cm$^2$) for example is introduced by ion implantation in energy of about 30 (keV). The n type impurity may be introduced not only by the ion implantation but also by the thermal diffusion.

Next, in the memory cell FM forming region of the EEPROM and the memory cell EM forming region of the EPROM respectively, first patterning is applied to the gate electrode layer 13 of the second layer. The patterning is performed to pattern the gate electrode layer 13 in the second layer and also to pattern (overlaid cutting) the interlayer insulation film 11 and the floating gate electrode 9 respectively in sequence using the same mask. According to the patterning, in the memory cell FM forming region of the EEPROM, a control gate electrode 13 of the field effect transistor Qf and a shunt wiring 13 of the memory cell selecting MISFET Qfs can be formed. Also in the memory cell EM forming region of the EPROM, a control gate electrode 13 of the field effect transistor can be formed. The patterning is performed, for example, using anisotropic etching of RIE or the like. In the memory cell FM of the EEPROM, since the field effect transistor Qf and the memory cell selecting MISFET Qfs respectively are formed in the two-layer gate structure by the overlaid cutting, the mask alignment dimension in the manufacturing process is not added to the dimension between the gate electrodes and the dimension therebetween can be defined in the processing accuracy of the mask, thereby the occupation area of the memory cell FM can be decreased.

In the memory cell DM forming region of the DRAM, and the n-channel MISFET Qn$_2$ forming region and the p-channel MISFET Qp$_2$ forming region of the CMOS respectively, second patterning is applied to the gate electrode layer 13 in the second layer. When the patterning is applied, as shown in FIGS. 7A and 7B, respective gate electrodes 13 of the memory cell selecting MISFET Qds of the memory cell DM, the n-channel MISFET Qn$_2$ and the p-channel MISFET Qp$_2$ can be formed. The patterning is performed, for example, using anisotropic etching of RIE or the like.

Oxidation processing is applied to the whole surface of the substrate by the thermal oxidation or other known method, and an insulation film 14 of about 300-500 (Å) is formed to cover the surface of the gate electrodes 9, 13, the floating gate electrode 9, and the control gate 13. The insulation film 14 is provided so as to increase the film thickness of the gate insulation films 6, 12 of the end of the respective gate electrodes 9, 13 and to improve the insulation withstanding voltage.

In the memory cell selecting MISFET Qds forming region of the DRAM, the memory cell FM forming region of the EEPROM, and the n-channel MISFETs Qn$_1$, Qn$_2$ forming region of the CMOS respectively, n type semiconductor region 15 is formed on the main surface portion of the semiconductor substrate 1. The n type semiconductor region 15 can be formed in that P of about $10^{13}$ (atoms/cm$^2$) for example is introduced by ion implantation in energy of about 50-80 (keV).

In the p-channel MISFETs Qp$_1$, Qp$_2$ forming region of the CMOS, p type semiconductor region 17 is formed on the main surface portion of the well region 2. The p type semiconductor region 17 can be formed in that B of about $10^{13}$ (atoms/cm$^2$) for example is introduced by on implantation in energy of about 10-20 (keV).

As shown in FIGS. 8A and 8B, in the memory cell EM forming region of the EPROM, n type semiconductor region 16 having higher impurity density than that of the n type semiconductor region 15 is formed on the main surface portion of the semiconductor substrate 1. The n type semiconductor region 16 is constituted mainly to raise the electric field intensity in the vicinity of the drain region and to increase the generating quantity of the hot carriers. The n type semiconductor region 16 is formed in that As of about $10^{15}$ (atoms/cm$^2$) for example is introduced by ion implantation in energy of about 60-100 (keV).

The semiconductor regions 15, 16, 17 respectively to constitute such LDD structure are formed in self-alignment to any of the gate electrodes 9, 13, the floating gate electrode 9 and the control gate electrode 13. The semiconductor regions 15, 16, 17 respectively may be changed in the forming order, or may be formed before forming the insulation film 14.

A side wall spacer 18 is formed to respective side walls of the gate electrodes 9, 13, the floating gate electrode 9 and the control gate electrode 13. The side wall spacer 18 can be formed by applying anisotropic etching of RIE or the like to the silicon oxide film deposited by CVD for example.

In the memory cell selecting MISFET Qds forming region of the memory cell DM of the DRAM, the memory cell FM forming region of the EEPROM, the memory cell EM forming region of the EPROM, and the n-channel MISFETs Qn$_1$, Qn$_2$ forming region of the CMOS, n$^+$ type semiconductor region 19 is formed on the main surface portion of the semiconductor substrate 1. The n$^+$ type semiconductor region 19 can be formed in that As of about $10^{16}$ (atoms/cm$^2$) for example is introduced by ion implantation in energy of about 60-100 (keV). The n$^+$ type semiconductor region 19 is formed in self-alignment to the gate electrodes 9, 13, the floating gate electrode 9 and the control gate electrode 13 respectively. According to the process of forming the n$^+$ type semiconductor region 19, the memory cell selecting MISFET Qds of the memory cell DM, the field effect transistor Qf of the memory cell FM, the memory cell selecting MISFET Qfs, the field effect transistor of the memory cell EM, and the n-channel MISFETs Qn$_1$, Qn$_2$ respectively are completed.

As shown in FIGS. 9A and 9B, in the p-channel MISFETs $Q_{p1}$, $Q_{p2}$ forming regions respectively of the CMOS, $p^+$ type semiconductor region 20 is formed on the main surface portion of the well region 2. The $p^+$ type semiconductor region 20 can be formed in that B of about $10^{15}$ (atoms/cm$^2$) for example is introduced by ion implantation in energy of about 10–20 (keV). According to the process of forming the $p^+$ type semiconductor region 20, the p-channel MISFETs $Q_{p1}$, $Q_{p2}$ respectively are completed.

An interlayer insulation film 21 and a connecting hole 22 respectively are formed in sequence, and a wiring is formed as shown in FIGS. 1A and 1B. The interlayer insulation film 21 is formed by a single layer of BPSG (Boron-doped Phosphosilicate glass) film or PSG (Phosphosilicate glass) film deposited by CVD for example, or by a composite film using these as main component. The interlayer insulation film 21 is formed in film thickness of about 4500 (Å) for example. Also the connecting hole 22 is formed using the known dry etching technology. The wiring 23 is formed by vacuum evaporation or sputter evaporation of Al or Al-Si.

And then a final passivation film (not shown) is formed on the whole surface of the substrate in a silicon oxide film of about 1.2 ($\mu$m) by CVD for example thereby the semiconductor integrated circuit device of Embodiment I is completed.

In the manufacturing method of the semiconductor integrated circuit device provided with the memory cell (dynamic type memory element) DM of the DRAM having the information storing capacitance element C and the memory cell (non-volatile memory element) FM of the EEPROM having the tunnel insulation film 8, process of forming the dielectric film 8 of the information storing capacitance element C of the memory cell DM and process of forming the tunnel insulation film 8 of the memory cell FM are performed in the same manufacturing process. Consequently, since the tunnel insulation film 8 can be formed in the process of forming the dielectric film 8, the manufacturing process of the semiconductor integrated circuit device can be reduced corresponding to the process of forming the tunnel insulation film 8.

Also in the manufacturing method of the semiconductor integrated circuit device provided with the memory cell DM of the DRAM having the information storing capacitance element C and the memory cell FM of the EEPROM having the tunnel insulation film 8, process of forming the semiconductor region 7 to constitute the lower electrode of the information storing capacitance element C of the memory cell DM and process of forming the semiconductor region 7 of the field effect transistor Qf of the memory cell FM are performed in the same manufacturing process, and then process of forming the dielectric film 8 of the information storing capacitance element C and process of forming the tunnel insulation film 8 of the field effect transistor Qf are performed in the same manufacturing process. Consequently, since the semiconductor region 7 and the tunnel insulation film 8 of the field effect transistor Qf can be formed in the process of forming the semiconductor region 7 and the dielectric film 8 of the information storing capacitance element C, the manufacturing process of the semiconductor integrated circuit device can be reduced corresponding to the process of forming the semiconductor region 7 and the tunnel insulation film 8.

Also in the manufacturing method of the semiconductor integrated circuit device provided with the memory cell DM of the DRAM having the information storing capacitance element C and the memory cell FM of the EEPROM (and/or the memory cell EM of the EPROM) having the floating gate 9, process of forming the plate electrode (upper electrode) 9 of the information storing capacitance element C of the memory cell DM and process of forming the floating gate electrode 9 of the memory cell FM (and/or the memory cell EM) are performed in the same manufacturing process. Consequently, since the floating gate electrode 9 can be formed in the process of forming the plate electrode 9 of the information storing capacitance element C, the manufacturing process of the semiconductor integrated circuit device can be reduced corresponding to the process of forming the floating gate electrode 9.

Also in the manufacturing method of the semiconductor integrated circuit device provided with the memory cell DM of the DRAM having the information storing capacitance element C and the memory cell selecting MISFET Qds and the memory cell FM of the EEPROM (and/or the memory cell EM of the EPROM) having the floating gate electrode 9 and the control gate electrode 13, process of forming the plate electrode (upper electrode) 9 of the information storing capacitance element C of the memory cell DM and process of forming the floating gate electrode 9 of the memory cell FM (and/or the memory cell EM) are performed in the same manufacturing process, and process of forming the gate electrode 13 of the memory cell selecting MISFET Qds of the memory cell DM and process of forming the control gate electrode 13 of the memory cell FM (or the memory cell EM) are performed in the same manufacturing process. Consequently, since the floating gate electrode 9 and the control gate electrode 9 of the memory cell FM can be formed in the process of forming the plate electrode 9 of the information storing capacitance element C and the gate electrode 13 of the memory cell selecting MISFET Qds, the manufacturing process of the semiconductor integrated circuit device can be reduced corresponding to the process of forming the floating gate electrode 9 and the control gate electrode 13.

Further in the manufacturing method of the semiconductor integrated circuit device having the memory cell DM of the DRAM and the memory cell FM of the EEPROM, process of forming the semiconductor region 7 of the information storing capacitance element C of the memory cell DM, the dielectric film 8, the plate electrode 9, the gate electrode 13 of the memory cell selecting MISFET Qds respectively and process of forming the semiconductor region 7 of the memory cell FM, the tunnel insulation film 8, the floating gate electrode 9, the control gate electrode 13 respectively are performed in the same manufacturing process. Consequently, since the semiconductor region 7 of the memory cell FM, the tunnel insulation film 8, the floating gate electrode 9, the control gate electrode 13 respectively can be formed in the process of forming the semiconductor region 7 of the memory cell DM, the dielectric film 8, the plate electrode 9, the gate electrode 13 respectively, the manufacturing process of the semiconductor integrated circuit device can be more decreased corresponding to this.

(Embodiment II)

Embodiment II is a second embodiment of the invention where the plate electrode of the information storing capacitance element of the memory cell of the DRAM in the semiconductor integrated circuit device in Embodiment I is formed by gate electrode material of a second layer, and the gate electrode of the memory cell selecting MISFET is formed by gate electrode material of a first layer.

A semiconductor integrated circuit device containing a microcomputer as Embodiment II of the invention is shown in FIG. 10 (main part sectional view showing each element). Since Embodiment II has the same structure as that of Embodiment I in respective element structure except for a memory cell of a DRAM, FIG. 10 shows only a memory cell DM of a DRAM, a memory cell FM of an EEPROM and a memory cell EM of an EPROM.

As shown in FIG. 10, the memory cell DM of the DRAM of the semiconductor integrated circuit device is constituted by series circuit of a memory cell selecting MISFET Qds and an information storing capacitance element C.

The information storing capacitance element C of the memory cell DM is constituted in planar structure where n type doped semiconductor region (lower electrode) 7, a dielectric film 8, a plate electrode (upper electrode) 13 respectively are overlaid in sequence. The plate electrode 13 is formed by gate electrode material in a second layer. The dielectric film 8 similar to a tunnel insulation film 8 of a field effect transistor Qf of the memory cell FM of the EEPROM is formed in small film thickness of about 100 (Å).

The memory cell selecting MISFET Qds is composed of a semiconductor substrate 1, a gate insulation film 6, a gate electrode 9, a pair of n type semiconductor regions 15 and a pair of n+ type semiconductor regions 19 being source region and drain region. The gate electrode 9 is formed by gate electrode material in a first layer.

Figure 11:
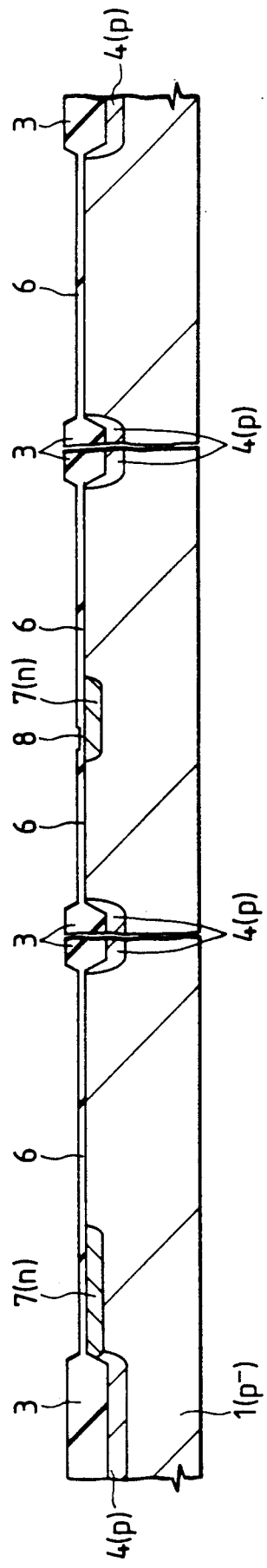

Next, manufacturing method of the semiconductor integrated circuit device will be briefly described using FIG. 11 through FIG. 13 (main part sectional view in each manufacturing process).

First, in similar manner to Embodiment I, a well region 2 is formed on the semiconductor substrate 1, and then a field insulation film 3 and p type channel stopper region 4 respectively are formed in sequence.

Next, in the semiconductor element forming region, a gate insulation film 6A of about 400-490 (Å) is formed on respective main surfaces of the semiconductor substrate 1 and the well region 2 by thermal oxidation or the like.

A semiconductor region 7 is formed on the main surface portion of the semiconductor substrate 1 of the information storing capacitance element C forming region of the memory cell DM of the DRAM, the field effect transistor Qf forming region of the memory cell FM of the EEPROM respectively.

In the field effect transistor Qf forming region of the memory cell FM of the EEPROM, a part of the gate insulation film 6A on the semiconductor region 7 is removed by dry etching or the like, and as shown in FIG. 11, a tunnel insulation film 8 of about 100 (Å) is formed on the removed region by thermal oxidation or the like. According to the process of forming the tunnel insulation film 8, the gate insulation film 6A in other region is grown into the gate insulation film 6 of about 500 (Å). Being different from Embodiment I, in Embodiment II the dielectric film 8 of the information storing capacitance element C is formed by process separated from that forming the tunnel insulation film 8.

A gate electrode layer 9 in the first layer is formed on the whole surface of the substrate including the gate insulation film 6 and the tunnel insulation film 8. Prescribed patterning is applied to the gate electrode layer 9 of the first layer, and a gate electrode 9 and a floating gate electrode 9 are formed. The gate electrode 9 is formed on respective gate insulation films 6 of the memory cell selecting MISFET Qds forming region of the memory cell DM of the DRAM and the memory cell selecting MISFET Qfs forming region of the memory cell FM of the EEPROM. The floating gate electrode 9 is formed on the gate insulation film 6 and the tunnel insulation film 8 of the field effect transistor Qf of the memory cell FM of the EEPROM and on the gate insulation film 6 of the memory cell EM of the EPROM respectively. Although not shown, the gate electrode 9 is also formed on respective gate insulation films 6 of the n-channel MISFET Qn1 forming region and the p-channel MISFET Qp1 forming region of the CMOS of the peripheral circuit. An insulation film 11A is formed on respective surfaces of the gate electrode 9 and the floating gate electrode 9. The insulation film 11A is formed by a silicon oxide film where the respective surfaces of the gate electrode 9 and the floating gate electrode 9 are oxidized by thermal oxidation or the like. According to the process of forming the insulation film 11A, although not shown, on the main surface of the semiconductor substrate 1 of the n-channel MISFET Qn2 forming region of the peripheral circuit and on the main surface of the well region 2 of the p-channel MISFET Qp2 forming region respectively, a gate insulation film used as a part of the gate insulation film 12 is formed.

As shown in FIG. 12, the gate insulation film 6 of the information storing capacitance element C forming region of the memory cell DM of the DRAM is selectively removed using the known dry etching technology, and the main surface of the semiconductor region 7 is exposed.

A dielectric film 8 of about 100 (Å) is formed on the main surface of the exposed semiconductor region 7. The dielectric film is formed by a silicon oxide film where the main surface of the semiconductor substrate 1 for example is oxidized by thermal oxidation or the like. The dielectric film 8 is formed in process separate from that of the tunnel insulation film 8, but formed in small film thickness being substantially similar to this. According to the process of forming the dielectric film 8, the insulation film 11A can be grown, and an insulation film 11 of about 300-400 (Å) can be formed on the surface of the gate electrode 9 and a gate insulation film 11 can be formed on the surface of the floating gate electrode 9. Then in the n-channel MISFET Qn2 forming region and the p-channel MISFET Qp2 forming region of the CMOS of the peripheral circuit respectively, the gate insulation film can be grown and the gate insulation film of about 250 (Å) can be formed.

A gate electrode layer 13 in a second layer is formed on the whole surface of the substrate including the dielectric film 8, the gate insulation film 11 (and the gate insulation film 12 although not shown) or the like. Second patterning is applied to the gate electrode layer 13 in the second layer, and as shown in FIG. 13, a plate electrode 13, a control gate electrode 13, a shunt wiring 13 (and a gate electrode 13 of the peripheral circuit) respectively are formed.

And then, in similar manner to Embodiment I, an insulation film 14, semiconductor regions 15, 16, 17, a side wall spacer 18, semiconductor regions 19, 20, a connecting hole 22, a wiring 23 respectively are formed in sequence, thereby the semiconductor integrated circuit device of Embodiment II is completed.

The semiconductor integrated circuit device constituted as above described has following effects in addition to the effects of Embodiment I.

In the manufacturing method of the semiconductor integrated circuit device provided with the memory cell DM of the DRAM having the information storing capacitance element C and the memory cell FM of the EEPROM (and/or the memory cell EM of the EPROM) having the control gate electrode 13, process of forming the plate electrode (upper electrode) 13 of the information storing capacitance element C of the memory cell DM and process of forming the control gate electrode 13 of the memory cell FM (and/or the memory cell EM) are performed in the same manufacturing process. Consequently, since the control gate electrode 13 can be formed in the process of forming the plate electrode 13 of the information storing capacitance element C, the manufacturing process of the semiconductor circuit device can be reduced corresponding to the process of forming the control gate electrode 13.

Also in the manufacturing method of the semiconductor integrated circuit device provided with the memory cell DM of the DRAM having the information storing capacitance element C and the memory cell selecting MISFET Qds and the memory cell FM of the EEEPROM (and/or the memory cell EM of the EPROM) having the floating gate electrode 9 and the control gate electrode 13, process of forming the floating gate electrode 9 of the memory cell FM and process of forming the gate electrode 9 of the memory cell selecting MISFET Qds of the memory cell DM are performed in the same manufacturing process, and process of forming the control gate electrode 13 of the memory cell FM and process of forming the plate electrode 13 of the information storing capacitance element C of the memory cell DM are performed in the same manufacturing process. Consequently, since the floating gate electrode 9 and the control gate electrode 9 of the memory cell FM can be formed in the process of forming the gate electrode 9 of the memory cell selecting MISFET Qds and the plate electrode 13 of the information storing capacitance element C, the manufacturing process of the semiconductor integrated circuit device can be reduced corresponding to the process of forming the floating gate electrode 9 and the control gate electrode 13.

Further in the manufacturing method of the semiconductor integrated circuit device having the memory cell DM of the DRAM and the memory cell FM of the EEEPROM, process of forming the semiconductor region 7 of the information storing capacitance element C of the memory cell DM, the plate electrode 13, the gate electrode 9 of the memory cell selecting MISFET Qds respectively and process of forming the semiconductor region 7 of the memory cell FM, the control gate electrode 13, the floating gate electrode 9 respectively are performed in the same manufacturing process. Consequently, the semiconductor region 7 of the memory cell FM, the control gate electrode 13, the floating gate electrode 9 respectively can be formed in the process of forming the semiconductor region 7 of the memory cell DM, the plate electrode 13, the gate electrode 9 respectively, the manufacturing process of the semiconductor integrated circuit device can be more reduced corresponding to this.

(Embodiment III)

Embodiment III is a third embodiment of the invention where the semiconductor element in the semiconductor integrated circuit device in Embodiment I is constituted in one-layer gate structure.

Figure 14A:
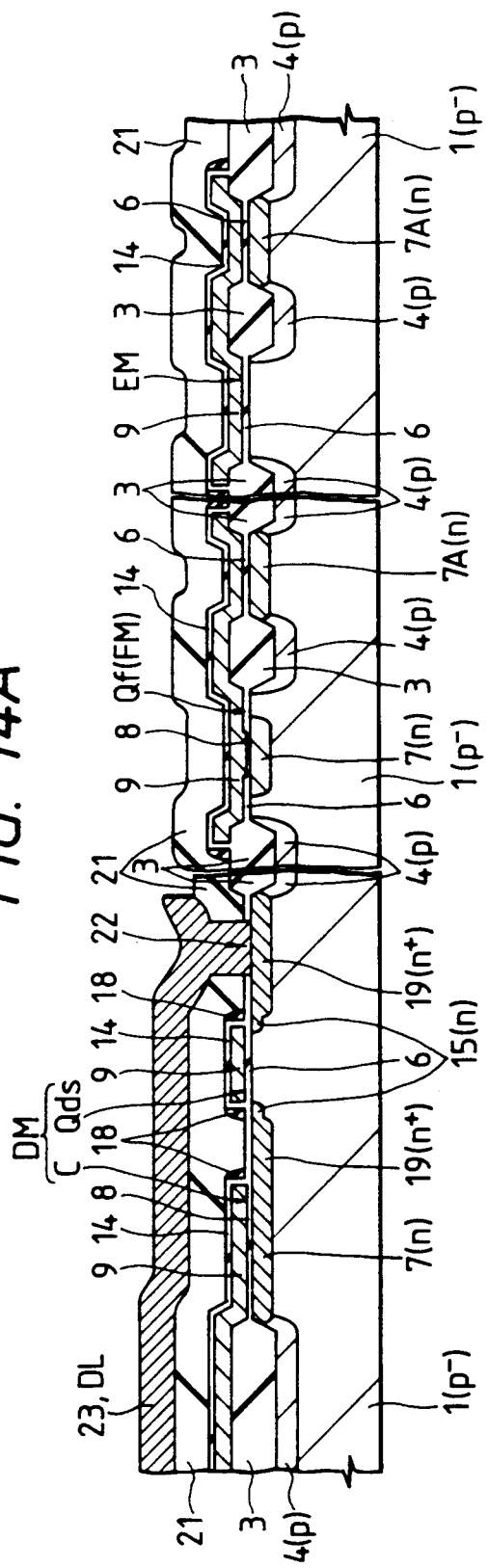
FIGS. 14A and 14B are main part sectional views of a semiconductor integrated circuit device containing a microcomputer as Embodiment III of the invention.
Figure 14B:
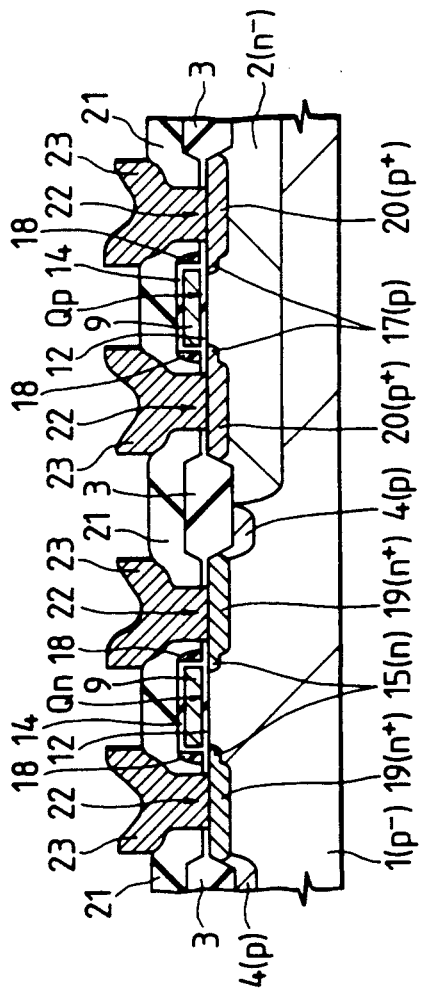

A semiconductor integrated circuit device containing a microcomputer as Embodiment III of the invention is shown in FIGS. 14A and 14B (main part sectional view showing each element).

As shown in FIGS. 14A and 14B, an information storing capacitance element C of a memory cell DM of a DRAM is constituted in planar structure where n-type doped semiconductor region (lower electrode) 7, a dielectric film 8, a plate electrode (upper electrode) 9 respectively are overlaid in sequence. The plate electrode 9 is formed by gate electrode material in a first layer. The dielectric film 8 similar to Embodiment I is formed in small film thickness of about 100 (Å).

The memory cell selecting MISFET Qds is composed of a semiconductor substrate 1, a gate insulation film 6, a gate electrode 9, a pair of n type semiconductor regions 15 and a pair of n+ type semiconductor regions 19 being source region and drain region. The gate electrode 9 is formed by gate electrode material in the first layer. That is, the memory cell DM of the DRAM is constituted by one-layer gate structure.

Figure 17A:
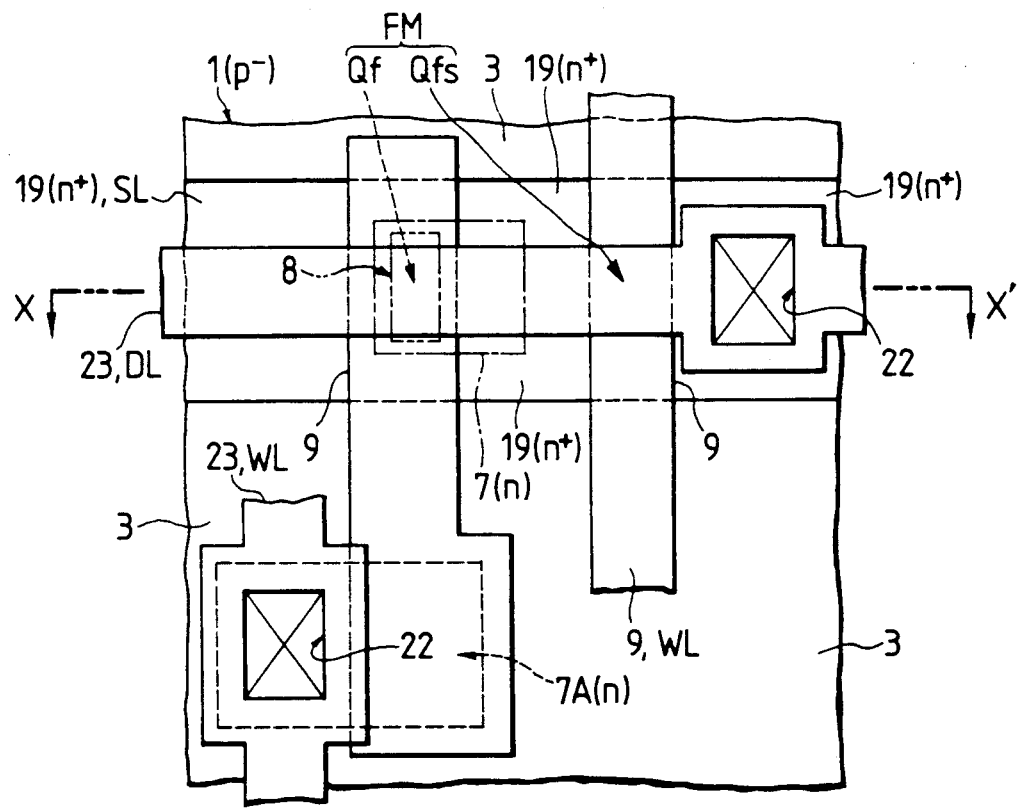
FIG. 17A is a plan view of a memory cell of an EEPROM of the semiconductor integrated circuit device of Embodiment III.
Figure 17B:
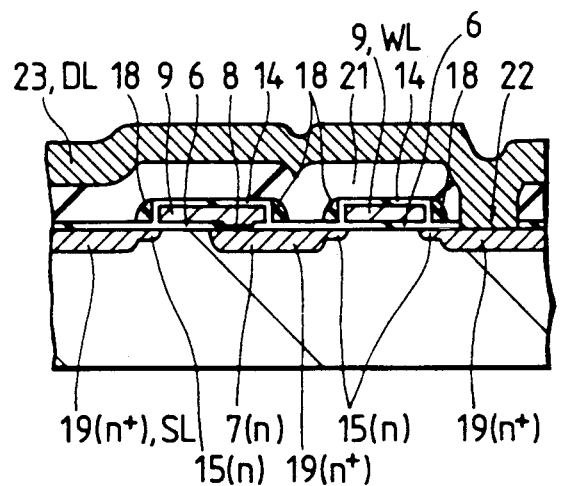
FIG. 17B is a main part sectional view of the memory cell of the EEPROM of the semiconductor integrated circuit device of Embodiment III.

Although the sectional structure being not shown in FIGS. 14A and 14B, a memory cell FM of an EEEPROM is constituted by series circuit of a field effect transistor Qf and a memory cell selecting MISFET Qfs as shown in FIG. 17A (plan view of a memory cell). FIG. 17B shows a sectional view taken in arrow X-X' in FIG. 17A.

As shown in FIG. 17B, the field effect transistor Qf is mainly composed of the semiconductor substrate 1, n type doped semiconductor region 7, a gate insulation film (first gate insulation film) 6, a tunnel insulation film 8, a floating gate electrode 9, a gate insulation film (second gate insulation film) 6, a control gate electrode 7A, a pair of n type semiconductor regions 15 and a pair of n+ type semiconductor regions 19 being source region and drain region. The floating gate electrode 9 is constituted by gate electrode material in the first layer. The floating gate electrode 9 as shown in FIG. 17A extends in the gate width direction onto the control gate electrode 7A formed in the n type doped semiconductor region, and the semiconductor region 7, the control gate electrode 7A, the tunnel oxide film 8 and the floating gate electrode 9 respectively correspond to the semiconductor region 7 of the field effect transistor Qf, the control gate electrode 7A, the tunnel oxide film 8 and the floating gate electrode 9 in FIG. 14A. The gate insulation film (second gate insulation film) 6 is provided between the floating gate electrode 9 and the control gate electrode 7A. The control gate electrode 7A is formed in the same manufacturing process as that of the semiconductor region 7. The control gate electrode 7A is connected through via a connecting hole 22 to a wiring 23 used as a word line WL.

The memory cell selecting MISFET Qfs is mainly composed of the semiconductor substrate 1, a gate insulation film 6, a gate electrode 9, a pair of n type semiconductor regions 15 and a pair of n+ type semiconductor regions 19 being source region and drain region as shown in FIG. 17B. The gate electrode 9 is constituted by gate electrode material in the first layer. The gate electrode 9 is constituted integrally with the word line (WL) 9 as shown in FIG. 17A. The memory cell selecting MISFET Qfs is constituted in substantially the same structure as that of the memory cell selecting MISFET Qds of the memory cell DM of the DRAM and the n-channel MISFET Qn of the peripheral circuit. That is, the field effect transistor Qf of the memory cell FM of the EEPROM and the memory cell selecting MISFET Qfs respectively are constituted in one-layer gate structure.

Referring to FIGS. 14A and 14B again, the memory cell EM of the EPROM is constituted in similar structure to the field effect transistor Qf of the memory cell FM of the EEPROM. That is, the memory cell EM is mainly composed of the semiconductor substrate 1, a gate insulation film (first gate insulation film) 6, a floating gate electrode 9, a gate insulation film (second gate insulation film) 6 and a control gate electrode 7A. The memory cell (field effect transistor) EM is constituted in one-layer gate structure. The n-channel MISFET Qn of the CMOS of the peripheral circuit is composed of the semiconductor substrate 1, a gate insulation film 12, a gate electrode 9, a pair of n type semiconductor regions 15 and a pair of n+ type semiconductor regions 19 being source region and drain region. The gate electrode 9 is formed by gate electrode material in the first layer.

The p-channel MISFET Qp is composed of a well region 2, a gate insulation film 12, a gate electrode 9, a pair of p type semiconductor regions 17 and a pair of p+ type semiconductor regions 20 being source region and drain region. The gate electrode 9 is formed by gate electrode material in the first layer. That is, the n-channel MISFET Qn and the p-channel MISFET Qp respectively of the CMOS are constituted in one-layer gate structure.

Next, manufacturing method of the semiconductor integrated circuit device will be briefly described using FIGS. 15A and 15B and FIGS. 16A and 16B (main part sectional view in each manufacturing process).

First, in similar manner to Embodiment I, a well region 2 is formed on the main surface portion of the semiconductor substrate 1, and then a field insulation film 3 and p type channel stopper region 4 are formed respectively.

Next, in the semiconductor element forming region, 15 an insulation film 6A used as a part of the gate insulation film is formed about 400–450 (Å) on respective main surface portions of the semiconductor substrate 1 and the well region 2 by thermal oxidation or the like.

In the n-channel MISFET Qn forming region and the p-channel MISFET Qp forming region respectively of the CMOS of the peripheral circuit, the insulation film 6A is selectively removed by dry etching or the like.

In the n-channel MISFET Qn forming region and the p-channel MISFET Qp forming region respectively where the insulation film 6A is removed, a gate insulation film 12 of about 250 (Å) is newly formed on respective main surfaces of the semiconductor substrate 1 and the well region 2 by thermal oxidation or the like. According to the process of forming the gate insulation film 12, the insulation film 6A is grown and the gate insulation film 6 of about 500 (Å) is formed on the respective main surfaces of the semiconductor substrate 1 and the well region 2.

As shown in FIGS. 15A and 15B, in the information storing capacitance element C forming region of the memory cell DM of the DRAM, the forming region of the field effect transistor Qf and the memory cell selecting MISFET Qfs of the memory cell FM of the EEPROM, the memory cell EM forming region of the EPROM respectively, the semiconductor region 7 and the control gate electrode 7A are formed on the main surface portion of the semiconductor substrate 1. The semiconductor region 7 and the control gate electrode 7A can be formed respectively in that n type impurity, for example, P of about $10^{13}$ (atoms/cm$^2$) is introduced by ion implantation in energy of about 50–80 (keV).

In the information storing capacitance element C forming region of the memory cell DM of the DRAM, the field effect transistor Qf forming region of the memory cell FM of the EEPROM respectively, the gate insulation film 6 is selectively removed by dry etching or the like. A dielectric film 8 and a tunnel insulation film 8 respectively of about 100 (Å) are formed on the main surface of the removed semiconductor substrate 1 by thermal oxidation or the like.

A gate electrode layer 9 in the first layer is formed on the whole surface of the substrate including the gate insulation films 6, 12, the dielectric film 8, the tunnel insulation film 8 respectively. The gate electrode 9 in the first layer is formed by a polycrystalline silicon film deposited by CVD for example. The n type impurity to reduce the resistance value after the depositing, for example, P of about $10^{15-16}$ (atoms/cm$^2$) is introduced to the polycrystalline silicon film by ion implantation in energy of about 30 (keV). The n type impurity may be introduced not only by the ion implantation but also by the thermal diffusion. And then prescribed patterning is applied to the gate electrode layer 9 in the first layer, for example, using anisotropic etching of RIE or the like, thereby the plate electrode 9, the gate electrode 9 and the floating gate electrode 9 respectively can be formed as shown in FIGS. 16A and 16B. The plate electrode 9 forms the upper electrode of the information storing capacitance element C of the memory cell DM of the DRAM. The gate electrode 9 forms respective gate electrodes of the memory cell selecting MISFET Qds of the memory cell DM, the memory cell selecting MISFET Qfs of the memory cell FM of the EEPROM, and the MISFETs Qn and Qp of the CMOS of the peripheral circuit. The floating gate electrode 9 forms respective floating gate electrodes of the field effect transistor Qf of the memory cell FM and the memory cell EM of the EPROM.

In similar manner to Embodiment I, an insulation film 14, semiconductor regions 15, 16, 17, a side wall spacer 18, semiconductor regions 19, 20, an interlayer insulation film 21, a connecting hole 22 and a wiring 23 respectively are formed in sequence, thereby the semiconductor integrated circuit device is completed as shown in FIGS. 14A and 14B.

The semiconductor integrated circuit device constituted as above described has following effects in addition to the effects of Embodiment I.

In the manufacturing method of the semiconductor integrated circuit device provided with the memory cell DM of the DRAM and the memory cell FM of the EEPROM (and/or the memory cell EM of the EPROM), process of forming the semiconductor region (lower electrode) 7 of the information storing capacitance element C of the memory cell DM and process of forming the semiconductor region 7 and the control gate electrode 7A of the memory cell FM are performed in the same manufacturing process. Consequently, since the semiconductor region 7 and the control gate electrode 7A of the memory cell FM can be formed in the process of forming the semiconductor region 7 of the information storing capacitance element C, the manufacturing process of the semiconductor integrated circuit device can be reduced corresponding to the process of forming the semiconductor region 7 and the control gate electrode 7A.

Also in the manufacturing method of the semiconductor integrated circuit device provided with the memory cell DM of the DRAM and the memory cell FM of the EEPROM (and/or the memory cell EM of the EPROM), process of forming the plate electrode (upper electrode) 9 of the information storing capacitance element C of the memory cell DM and the gate electrode 9 of the memory cell selecting MISFET Qds and process of forming the floating gate electrode 9 of the field effect transistor Qf of the memory cell FM are performed in the same manufacturing process. Consequently, since the floating gate electrode 9 of the memory cell FM can be formed in the process of forming the plate electrode 9 of the information storing capacitance element C and the gate electrode 9 of the memory cell selecting MISFET Qds, the manufacturing process of the semiconductor integrated circuit device can be reduced corresponding to the process of forming the floating gate electrode 9.

Since the semiconductor integrated circuit device is constituted in one-layer gate structure, the conductive layer number becomes little and the manufacturing process of the semiconductor integrated circuit device can be simplified.

(Embodiment IV)

Embodiment IV is a fourth embodiment of the invention where the information storing capacitance element of the memory cell of the DRAM in the semiconductor integrated circuit device in Embodiment II is constituted in stacked structure.

Figure 18:
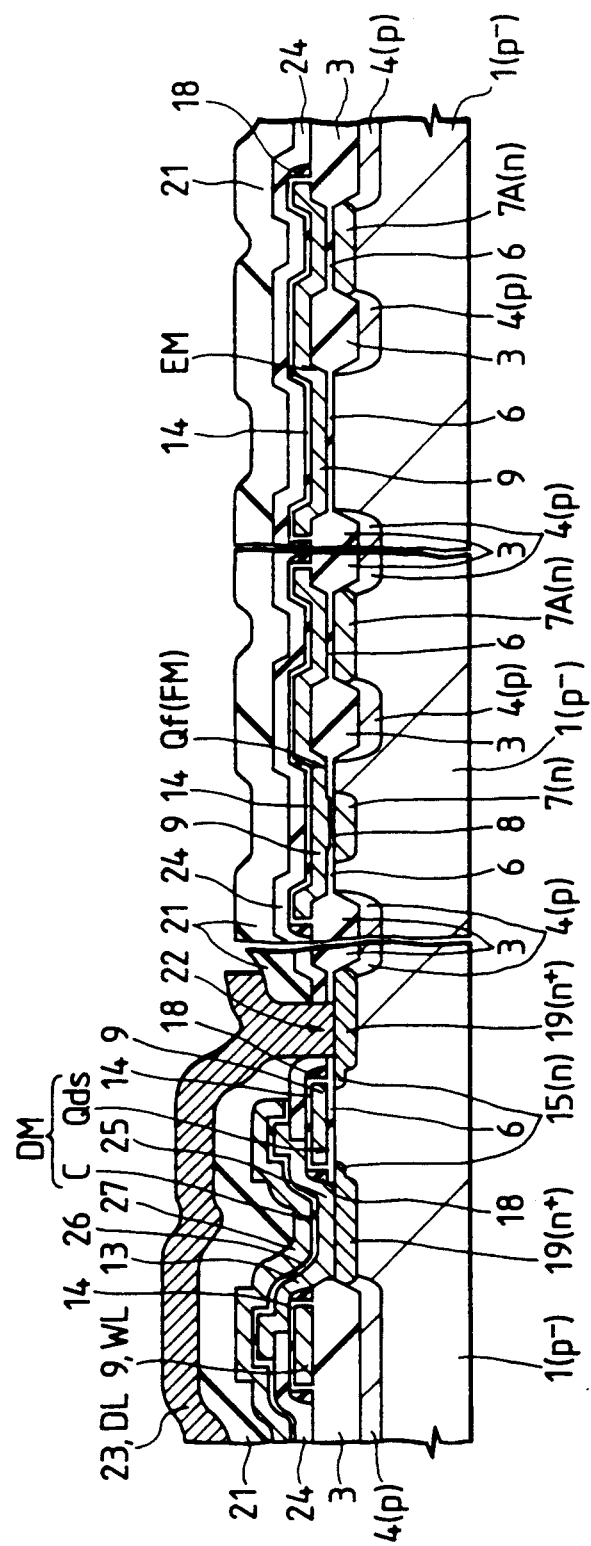
FIG. 18 is a main part sectional view of a semiconductor integrated circuit device containing a microcomputer as Embodiment IV of the invention.

A semiconductor integrated circuit device containing a microcomputer as Embodiment IV of the invention is shown in FIG. 18 (main part sectional view showing each element). Since Embodiment IV has the same structure as that of Embodiment III in respective element structure except for a memory cell DM of a DRAM, FIG. 18 shows only a memory cell DM of a DRAM, a memory cell FM of an EEPROM and a memory cell EM of an EPROM.

As shown in FIG. 18, the memory cell DM of the DRAM is constituted by series circuit of a memory cell selecting MISFET Qds and an information storing capacitance element C in stacked structure.

The memory cell selecting MISFET Qds is composed of a gate electrode 9 formed by gate electrode material in a first layer similar to Embodiment II.

The information storing capacitance element C is composed of a plate electrode (lower electrode) 13, a dielectric film 26 and a plate electrode (upper electrode) 27 respectively overlaid in sequence. The plate electrode 13 is connected to n+type semiconductor region 19 at the side being not connected to a data line 23 of the memory cell selecting MISFET Qds. This connection is performed through via a connecting hole 25 formed on an interlayer insulation film 24 and defined by a side wall spacer 18. The plate electrode 13 is formed by gate electrode material in a second layer, for example, a polycrystalline silicon film. The dielectric film 26 is formed in a single layer of a silicon oxide film, a silicon nitride film or a tantalum oxide film produced by insulation film forming method such as CVD, sputtering or the like, or in a composite film of these films. The plate electrode 27 is formed by gate electrode material in a third layer, for example, a polycrystalline silicon film deposited by CVD. The gate electrode materials in the second layer and the third layer respectively, although not shown, are used as wiring or a resistance element in other region.

The memory cell FM of the EEPROM, the memory cell EM of the EPROM, the CMOS of the peripheral circuit (not shown) respectively are constituted in one-layer gate structure similar to Embodiment III.

Next, manufacturing method of the semiconductor integrated circuit device will be briefly described.

First, in similar manner to Embodiment III, a well region 2 is formed on the semiconductor substrate 1, and then a field insulation film 3, p type channel stopper region 4, a gate insulation film 6, a semiconductor region 7, and a control gate 7A respectively are formed. According to this process, in similar manner to Embodiment III, an insulation film 12 of about 250 (Å) is formed in the n-channel MISFET Qn forming region and the p-channel MISFET Qp forming region of the CMOS of the peripheral circuit.

Next, in the forming region of the field effect transistor Qf of the memory cell FM of the EEPROM, a part of the gate insulation film 6 in film thickness of about 500 (Å) is selectively removed by dry etching or the like. A tunnel insulation film 8 of about 100 (Å) is formed by a silicon oxide film on the main surface of the removed semiconductor substrate 1 by thermal oxidation or the like.

A gate electrode layer 9 in the first layer is 15 formed on the whole surface of the substrate including the gate insulation films 6, 12 and the tunnel insulation film 8. The gate electrode 9 in the first layer is formed by a polycrystalline silicon film of about 2000–4000 (Å) deposited by CVD for example. The n type impurity to reduce the resistance value after the depositing, for example, P of about $10^{15-16}$ (atoms/cm$^2$) is introduced to the polycrystalline silicon film by ion implantation in energy of about 30 (keV). The n type impurity may be introduced not only by the ion implantation but also by the thermal diffusion. And then prescribed patterning is applied to the gate electrode layer 9 in the first layer, for example, using anisotropic etching of RIE or the like, thereby the gate electrode 9 and the floating gate electrode 9 respectively can be formed. The gate electrode 9 forms respective gate electrodes of the memory cell selecting MISFET Qds of the memory cell DM, the memory cell selecting MISFET Qfs of the memory cell FM of the EEPROM, and the MISFETs Qn and Qp of the CMOS of the peripheral circuit. The floating gate electrode 9 forms respective floating gate electrodes of the field effect transistor Qf of the memory cell FM and the memory cell EM of the EPROM.

In similar manner to Embodiment III, an insulation film 14, n type semiconductor regions 15, 16, 17, a side wall spacer 18, and semiconductor regions 19, 20 respectively are formed in sequence.

An interlayer insulation film 24 is formed about 2000–4000 (Å). The interlayer insulation film 24 can be formed in that a silicon oxide film deposited by CVD for example is subjected to prescribed patterning by dry etching or the like.

In the forming region of the information storing capacitance element C of the memory cell DM of the DRAM, the gate insulation film 6 is selectively removed by dry etching or the like.

A gate electrode layer 13 in the second layer is formed on the whole surface of the substrate including the information storing capacitance element C. The gate electrode layer 13 in the second layer is formed by a polycrystalline silicon film of about 2000–4000 (Å) deposited by CVD for example. The n type impurity to reduce the resistance value after the depositing, for example, P of about $10^{15-16}$ (atoms/cm$^2$) is introduced to the polycrystalline silicon film by ion implantation in energy of about 30–100 (keV). The n type impurity may be introduced not only by the ion implantation but also by the thermal diffusion. And then prescribed patterning is applied to the gate electrode 13 in the second layer, for example, using anisotropic etching of RIE or the like, thereby a plate electrode 13 can be formed. The plate electrode 13 forms a lower electrode of the information storing capacitance element C.

Next, a dielectric film 26 is formed. The dielectric formed, for example, in a composite film where a silicon oxide film of about 50 (Å) is deposited by CVD onto a silicon nitride film of about 100 (Å) deposited by CVD.

The silicon oxide film may be formed may be formed not only the insulation film forming method such as CVD, sputtering or the like but also by the thermal oxidation.

Prescribed patterning is applied to the dielectric film 26, for example, using anisotropic etching of RIE or the like, thereby the dielectric film 26 of the information storing capacitance element C of the memory cell of the DRAM can be formed. The dielectric film 26 may be formed in a single layer of a silicon oxide film, a silicon nitride film or a tantalum oxide film produced by insulation film forming method such as CVD, sputtering or the like, or in a composite fill of these films. The dielectric film 26 is formed by the insulation film forming method such as CVD, sputtering or the like, thereby the film of good coating property can be obtained.

The gate electrode layer 26 in the third layer is formed on the whole surface of the substrate including the information storing capacitance element C. The gate electrode 27 in the third layer is formed by a polycrystalline silicon film of about 2000–4000 (Å) deposited by CVD for example. The n type impurity to reduce the resistance value after the depositing, for example, P of about $10^{15-16}$ (atoms/cm$^2$) is introduced to the polycrystalline silicon film by ion implantation in energy of about 30–100 (keV). The n type impurity may be introduced not only by the ion implantation but also by the thermal diffusion.

And then prescribed patterning is applied to the gate electrode 27 in the third layer, for example, using anisotropic etching of RIE or the like, thereby a plate electrode 27 can be formed. The plate electrode 27 forms an upper electrode of the information storing capacitance element C of the memory cell DM of the DRAM.

In similar manner to Embodiment III, an interlayer insulation film 21, a connecting hole 22 and a wiring 23 are formed in sequence, thereby the semiconductor integrated circuit device is completed as shown in FIG. 18.

The semiconductor integrated circuit device constituted as above described has effects similar to those in Embodiment III.

Also in the semiconductor integrated circuit device, since the information storing capacitance element C is constituted in stacked structure, the occupation area of the memory cell DM can be decreased in comparison to the case that the information storing capacitance element C is constituted in planar structure.

(Embodiment V)

Embodiment V is a fifth embodiment of the invention where the information storing capacitance element of the memory cell of the DRAM in the semiconductor integrated circuit device in Embodiment I is constituted in stacked structure.

Figure 19A:
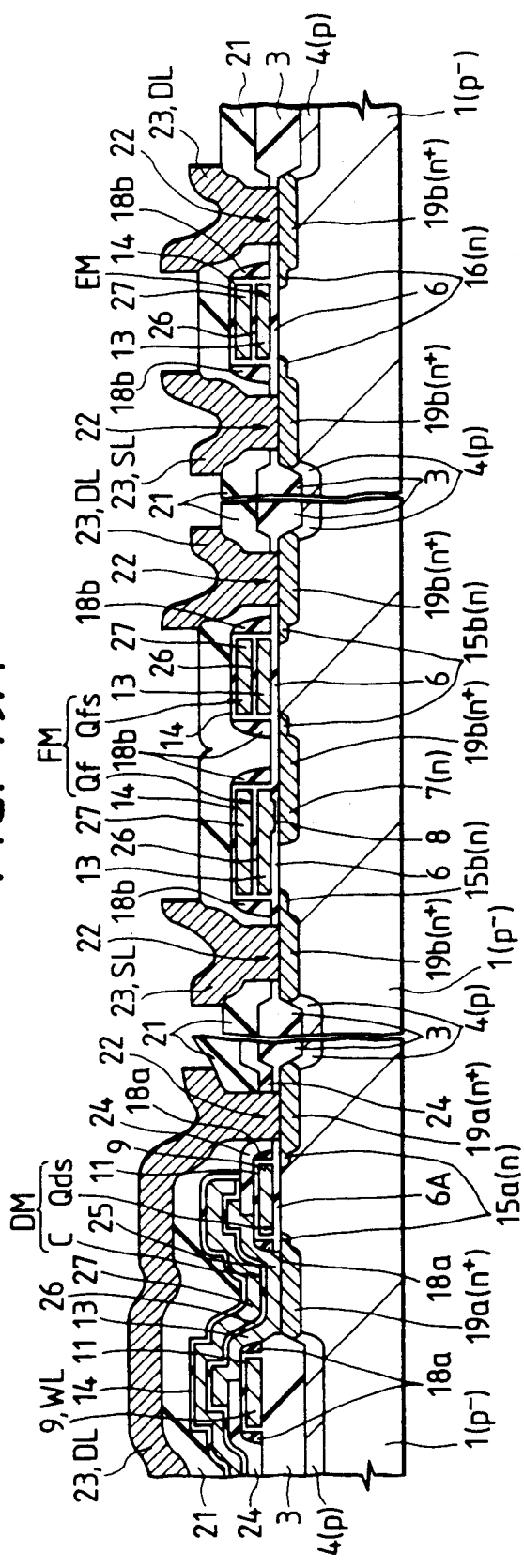
FIGS. 19A and 19B are main part sectional views of a semiconductor integrated circuit device containing a microcomputer as Embodiment V of the invention.
Figure 19B:
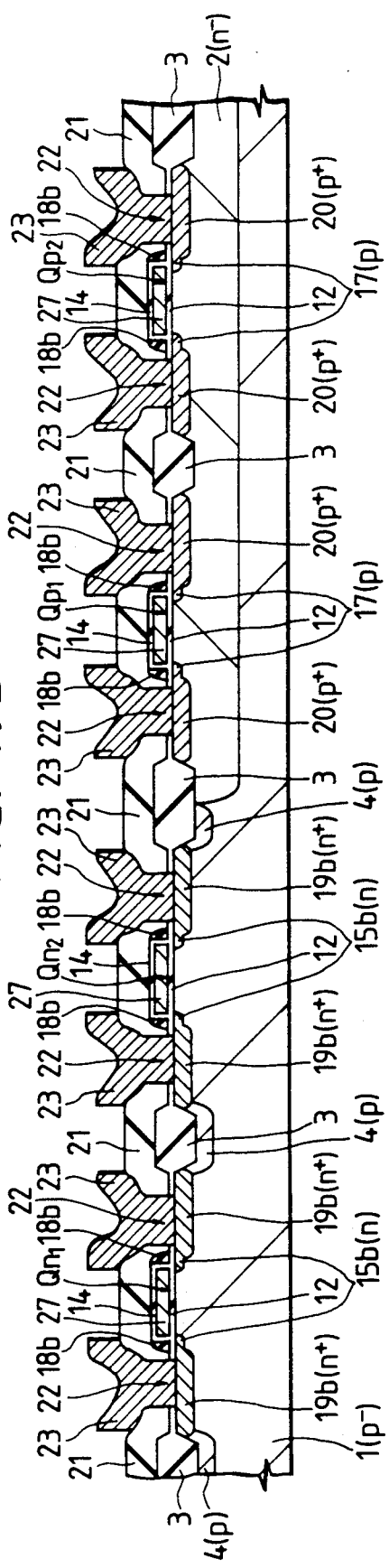

A semiconductor integrated circuit device containing a microcomputer as Embodiment V of the invention is shown in FIGS. 19A and 19B (main part sectional view showing each element). Embodiment V has the same structure as that of Embodiment I in respective element structure except for a memory cell of a DRAM. Also the memory cell DM of the DRAM constituted in stacked structure basically has the same structure as that of Embodiment IV.

As shown to the left side of FIG. 19A, the memory cell DM of the DRAM is constituted by series circuit of a memory cell selecting MISFET Qds and an information storing capacitance element C in stacked structure.

The memory cell selecting MISFET Qds is composed of a gate electrode 9 formed by gate electrode material in a first layer, for example, a polycrystalline silicon film.

The information storing capacitance element C is composed of a plate electrode (lower electrode) 13, a dielectric film 26 and a plate electrode (upper electrode) 27 respectively overlaid in sequence. The plate electrode 13 is connected to n$^+$ type semiconductor region 19a at the side being not connected to a data line 23 of the memory cell selecting MISFET Qds. This connection is performed through via a connecting hole 25 formed on an interlayer insulation film 24 and defined by a side wall spacer 18a. The plate electrode 13 is formed by gate electrode material in a second layer, for example, a polycrystalline silicon film. The dielectric film 26 is formed in a single layer of a silicon oxide film, a silicon nitride film or a tantalum oxide film produced by insulation film forming method such as CVD, sputtering or the like, or in a composite film of these films. The plate electrode 27 is formed by gate electrode material in a third layer, for example, a polycrystalline silicon film deposited by CVD. The gate electrode materials in the second layer and the third layer respectively, although not shown, are used as wiring or a resistance element in other region.

The memory cell FM of the EEPROM, as shown in center portion of FIG. 19A, is constituted by series circuit of a field effect transistor Qf of FLOTOX structure and a memory cell selecting MISFET Qfs similar to Embodiment I. That is, the memory cell FM of the EEPROM is constituted in two-transistor structure.

A floating gate electrode 13 of the field effect transistor Qf and a gate electrode 13 of the memory cell selecting MISFET Qfs are formed by gate electrode material in the second layer, and a control gate electrode 27 of the field effect transistor Qf and a shunt electrode 27 of the memory cell selecting MISFET Qfs are formed by gate electrode material in the third layer.

The memory cell EM of the EPROM, as shown to the right side of FIG. 19A, is composed of field effect transistors similar to Embodiment I. A floating gate electrode 13 and a control gate electrode 27 of the field effect transistor are formed by gate electrode materials in the second layer and the third layer respectively.

As shown in FIG. 19B, the n-channel MISFET Qn of the CMOS of the peripheral circuit is composed of the semiconductor substrate 1, a gate insulation film 12, a gate electrode 27, a pair of n type semiconductor regions 15b and a pair of n+ type semiconductor regions 19b being source region and drain region. The gate electrode 27 is formed by gate electrode material in the third layer.

The p-channel MISFET Qp is composed of a well region 2, a gate insulation film 12, a gate electrode 27, a pair of p type semiconductor regions 17 and a pair of p+type semiconductor regions 20 being source region and drain region. The gate electrode 27 is formed by gate electrode material in the third layer. That is, the n-channel MISFET Qn and the p-channel MISFET Qp of the CMOS respectively are constituted in one-layer gate structure. In order to reduce the resistance value, the gate electrode material may be formed by a high melting point metal film (Mo, W, Ta or Ti) or a high melting point metal silicide film ($MoSi_2$, $WSi_2$, $TaSi_2$ or $TiSi_2$) in a single layer, or a composite film where the high melting point metal film or the high melting point metal silicide film is provided on the polycrystalline silicon film.

Next, manufacturing method of the semiconductor integrated circuit device will be briefly described using FIGS. 20A and 20B.

In similar manner to Embodiment I, a well region 2 is formed on the main surface portion of the semiconductor substrate 1, and then a field insulation film 3, p type channel stopper region 4, a gate insulation film 6A and a semiconductor region 7 are formed respectively.

Next, a gate electrode layer 9 in the first layer is formed about 2000–4000 (Å) on the whole surface of the substrate similar to Embodiment I. The gate electrode layer 9 in the first layer is formed by a polycrystalline silicon film deposited by CVD for example. The n type impurity to reduce the resistance value after the depositing, for example, P is introduced to the polycrystalline silicon film. The n type impurity is formed in that P of about $10^{15-16}$ (atoms/cm$^2$) for example is introduced by ion implantation in energy of about 30 (keV).

Subsequently, prescribed patterning is applied to the gate electrode layer 9 in the first layer, and a gate electrode 9 is formed. The gate electrode 9 is formed on the gate insulation film 6 of the memory cell selecting MISFET Qds forming region of the memory cell DM of the DRAM.

Oxidation processing is applied to the whole surface of the substrate by thermal oxidation or the like, and a gate insulation film 11 in film thickness of about 300–400 (Å) for example is formed on the gate electrode 9.

In the memory cell DM forming region of the DRAM, n type semiconductor region 15a is formed on the main surface portion of the semiconductor substrate 1. The n type semiconductor region 15a can be formed in that P of about $10^{13}$ (atoms/cm$^2$) for example is introduced by ion implantation in energy of about 50-80 (keV).

A side wall spacer 18a is formed on side wall of the gate electrode 9. The side wall spacer 18a can be formed by applying anisotropic etching of RIE or the like to a silicon oxide film deposited by CVD for example.

In the memory cell DM forming region of the DRAM, n+ type semiconductor region 19a is formed on the main surface portion of the semiconductor substrate 1. The n+ type semiconductor region 19a can be formed in that As of about $10^{16}$ (atoms/cm$^2$) for example is introduced by ion implantation in energy of about 60–100 (keV). The n+ type semiconductor region 19a is formed in self-alignment to the gate electrode 9. According to the process of forming the n+ type semiconductor region 19a, the memory cell selecting MISFET Qds of the memory cell DM of the DRAM is completed.

As shown in FIGS. 20A and 20B, an interlayer insulation film 24 is formed. The interlayer insulation film 24 can be formed in that prescribed patterning by dry etching or the like is applied to a silicon oxide film deposited by CVD for example.

A part of the gate insulation film 6A of the field effect transistor Qf forming region of the memory cell FM of the EEPROM is removed by dry etching or the like. A tunnel insulation film 8 of about 100 (Å) is formed by a silicon oxide film on the main surface of the removed semiconductor region 1 by thermal oxidation or the like. According to the process of forming the tunnel insulation film 8, the gate insulation film 6A is grown and the gate insulation film 6 of about 500 (Å) is formed in similar manner to Embodiment I. The gate insulation film 6 in the information storing capacitance element C forming region of the memory cell DM of the DRAM is removed by dry etching or the like. The gate electrode layer 13 in the second layer is formed on the whole surface of the substrate including the main surface of the removed semiconductor substrate 1, the gate insulation film 6, the tunnel insulation film 8, the gate insulation film 11 and the interlayer insulation film 24 in similar manner to Embodiment I.

Prescribed patterning is applied to the gate electrode layer 13 in the second layer, for example, using anisotropic etching of RIE or the like, thereby a plate electrode 13 and a floating gate electrode 13 can be formed. The plate electrode 13 forms a lower electrode of the information storing capacitance element C of the memory cell DM of the DRAM. The floating gate electrode 13 in similar manner to Embodiment I is formed on the tunnel insulation film 8 and the gate insulation film 6 of the field effect transistor Qf forming region of the EEPROM and on the gate insulation film 6 of the field effect transistor forming region of the EPROM respectively. Respective floating gate electrodes 13 are patterned only in the gate width direction. The gate electrode 13 is formed on the gate insulation film 6 of the memory cell selecting MISFET Qfs forming region of the EEPROM. The gate electrode layer 13 in the second layer is formed by a polycrystalline silicon film deposited by CVD for example. The n type impurity is introduced to the polycrystalline silicon film in similar manner to the gate electrode layer 9 in the first layer. The n type impurity is formed in that P of about $10^{16}$ (atoms/cm$^2$) for example is introduced by ion implantation in energy of about 30 (keV).

Oxidation processing is applied to the whole surface of the substrate by thermal oxidation or other known method. A dielectric film 26 is formed on the surface of the plate electrode 13, and a gate insulation film 26 is formed on the surface of the floating gate electrode 13, and an insulation film 26 is formed on the surface of the gate electrode 13, and a gate insulation film 12 of about 250 (Å) is formed on the main surface of the semiconductor substrate 1 and on the main surface of the well region 2 respectively. The dielectric film 26, the gate insulation film 26 and the insulation film 26 respectively are formed in the same manufacturing process. The dielectric film 26, the gate insulation film 26 and the insulation film 26 are formed in film thickness of about 100–200 (Å) for example.

The dielectric film 26, the gate insulation film 26 and the insulation film 26 may be formed in a single layer of a silicon oxide film, a silicon nitride film or a tantalum oxide film produced by insulation film forming method such as CVD, sputtering or the like, or in a composite film of these films. For example, it may be formed in a composite film where a silicon oxide film of about 50 (Å) is deposited by CVD onto a silicon nitride film of about 100 (Å) deposited by CVD. The dielectric film 26 is formed by the insulation film forming method such as CVD, sputtering or the like, thereby the film of good coating property can be obtained.

A gate electrode layer 27 in the third layer is deposited about 2000–4000 (Å) on the whole surface of the substrate including the dielectric film 26, the gate insulation film 26, and the insulation film 26. The gate electrode layer 27 in the third layer is formed by a polycrystalline silicon film deposited by CVD for example. The n type impurity is introduced to the polycrystalline silicon film in similar manner to the gate electrode layer 9 in the second layer. The n type impurity is formed in that P of about $10^{16}$ (atoms/cm$^2$) for example is introduced by ion implantation in energy of about 30 (keV). The n type impurity may be introduced not only by the ion implantation but also by the thermal diffusion.

In the memory cell FM forming region of the EEPROM and the memory cell EM forming region of the EPROM respectively, first patterning is applied to the gate electrode layer 27 in the third layer. In this patterning, the gate electrode layer 27 in the third layer is patterned, and the gate insulation film 26 and the floating gate electrode 13 respectively are patterned in sequence (overlaid cutting) using the same mask. According to the patterning, in the memory cell FM forming region of the EEPROM, a control gate electrode 27 of the field effect transistor Qf and a shunt wiring 27 of the memory cell selecting MISFET Qfs can be formed. Also in the memory cell EM forming region of the EPROM, a control gate electrode 27 of the field effect transistor can be formed. The patterning is performed, for example, using anisotropic etching of RIE or the like. In the memory cell FM of the EEPROM, the field effect transistor Qf and the memory cell selecting MISFET Qfs respectively are formed in two-layer gate structure by the overlaid cutting.

Consequently, since the mask alignment margin dimension is not added to respective dimension between gate electrodes but the dimension between gate electrodes can be defined by the processing accuracy of the mask, the occupation area of the memory cell FM can be decreased.

In the memory cell DM forming region of the DRAM, and the n-channel MISFETs $Qn_1$, $Qn_2$ forming region and the p-channel MISFETs $Qp_1$, $Qp_2$ forming region of the CMOS respectively, second patterning is applied to the gate electrode layer 27 in the third layer. By applying the patterning, respective gate electrodes 27 of the information storing capacitance element C of the memory cell DM and the n-channel MISFETs $Qn_1$, $Qn_2$ and the p-channel MISFETs $Qp_1$, $Qp_2$ can be formed. The patterning is performed, for example, using anisotropic etching of RIE or the like.

Oxidation processing is applied to the whole surface of the substrate by thermal oxidation or other known method, and an insulation film 14 of about 300–500 (Å) is formed to cover the surface of the gate electrode 27 and the control gate electrode 27. The insulation film 14 increases respective film thickness of the gate insulation films 6, 12 at the end of the gate electrode 27, and improves the insulation withstanding voltage.

In the memory cell FM forming region of the EEPROM and the n-channel MISFETs $Qn_1$, $Qn_2$ forming region and the p-channel MISFETs $Qp_1$, $Qp_2$ forming region of the CMOS respectively, in similar manner to Embodiment I, an insulation layer 14, semiconductor regions 15b, 16, 17, a side wall spacer 18b, semiconductor regions 19b, 20, an interlayer insulation film 21, a connecting hole 22 and a wiring 23 respectively are formed in sequence, thereby the semiconductor integrated circuit device is completed as shown in FIGS. 19A and 19B.

In the semiconductor integrated circuit device having the memory cell DM (dynamic type memory element) of the DRAM, the memory cell FM (non-volatile memory element) of FLOTOX structure and MISFETs ($Qn_1$, $Qn_2$, $Qp_1$, $Qp_2$) of the peripheral circuit, the dielectric film 26 of the information storing capacitance element C of the memory cell DM and the tunnel insulation film 8 of the field effect transistor Qf of the memory cell DM are constituted in film thickness less than that of the gate insulation film 6 or 12 of the MISFET, thereby the charge storage quantity of the information storing capacitance element C can be improved and the occupation area of the memory cell DM can be decreased. Consequently, since the integration degree of the DRAM can be improved and the tunnel current quantity flowing through the tunnel insulation film 8 can be increased, the information write time of the memory cell FM of the EEPROM can be decreased and the insulation withstanding voltage of the gate insulation film 6 or 12 of the MISFET can be improved thereby the electric reliability can be improved.

Further in the manufacturing method of the semiconductor integrated circuit device having the memory cell DM of the DRAM and the memory cell FM of the EEPROM, since process of forming the plate electrode (lower electrode) 13, the dielectric film 26, the plate electrode (upper electrode) 27 respectively of the information storing capacitance element C of the memory cell DM and process of forming the floating gate electrode 13, the gate insulation film 26, the control gate electrode 27 respectively of the memory cell FM are performed in the same manufacturing process, the gate insulation film 26, the floating gate electrode 13, the control gate electrode 27 respectively of the memory cell FM can be formed in the process of forming the dielectric film 26, the plate electrode 13, the gate electrode 27 respectively of the memory cell DM, thereby the manufacturing process of the semiconductor integrated circuit device can be more reduced corresponding to this.

Also in the semiconductor integrated circuit device, since the information storing capacitance element of the memory cell of the DRAM is constituted in stacked structure, the occupation area of the memory cell DM can be decreased in comparison to the case that the information storing capacitance element C is constituted in planar structure.

Effects obtained by the typical invention disclosed in the present application will be briefly described as follows.

In the semiconductor integrated circuit device having the dynamic type memory element of the DRAM, the non-volatile memory element and the MISFET, the area of the dynamic type memory element is decreased and the integration degree is improved, and the operation speed of the non-volatile memory element is made high, and the insulation withstanding voltage of the gate insulation film of the MISFET can be improved.

Also in the semiconductor integrated circuit device having the dynamic type memory element and the non-volatile memory element, the manufacturing process ca be reduced.

The invention by the inventor has been described specifically based on the embodiments. However, the invention is not limited by the embodiments, but various modifications may be done, of course, without departing from the spirit thereof.

For example, in the invention, the memory cell of the EEPROM may be constituted in one-transistor structure (only the field effect transistor Qf).

Also in the invention, the memory cell of the EEPROM may be constituted by a field effect transistor of MNOS (Metal Nitride Oxide Semiconductor) structure.

What is claimed is:

1. A method of manufacturing a semiconductor device having dynamic type memory elements and non-volatile memory elements on a semiconductor substrate, each of the dynamic type memory elements having a capacitance element which comprises a first electrode, a second electrode, and a dielectric film disposed therebetween, and each of the non-volatile memory elements having a floating gate electrode, a control gate electrode over the floating gate electrode, and a tunnel insulation film below the floating gate electrode, the method comprising the step of:
    simultaneously forming the dielectric film of the capacitor element and the tunnel insulation film of the non-volatile memory element.

2. A method of manufacturing a semiconductor device according to claim 1, the method further comprising the step of:
    simultaneously forming the second electrode on the dielectric film and the floating gate electrode on the tunnel insulation film.

3. A method of manufacturing a semiconductor device according to claim 2, the method further comprising the step of:
    forming the first electrode of the capacitor element and a semiconductor region connected to a drain region of the non-volatile memory element,
    wherein the first electrode of the capacitor element and the semiconductor region are disposed in the semiconductor substrate, and the semiconductor region extends below the tunnel insulation film.

4. A method of manufacturing a semiconductor device according to claim 3, wherein the dynamic type memory element comprises a series circuit of a capacitance element and a MISFET, the method further comprising the step of:
    simultaneously forming a gate electrode of the MISFET in he dynamic type memory element and the control gate electrode.

5. A method of manufacturing a semiconductor device according to claim 4, wherein the dynamic type memory element is a dynamic random access memory cell, and the non-volatile memory element has a floating gate tunnel oxide structure.

6. A method of manufacturing a semiconductor device according to claim 5, wherein the dielectric film has smaller thickness than the gate insulation film of the MISFET in the dynamic random access memory cell.

7. A method of manufacturing a semiconductor device according to claim 6, wherein the dynamic random access memory is formed in the first region of the semiconductor substrate, and the nonvolatile memory elements are formed in the second region of the semiconductor substrate.

8. A method of manufacturing a semiconductor device according to claim 1, the method further comprising the step of:
    simultaneously forming the second electrode on the dielectric film and the control gate electrode.

9. A method of manufacturing a semiconductor device according to claim 8, wherein the dynamic type memory element comprises a series circuit of a capacitor element and a MISFET, the method further comprising the step of:
    simultaneously forming a gate electrode of the MISFET in the dynamic type memory element and the floating gate electrode.

10. A method of manufacturing a semiconductor device according to claim 9, wherein the dynamic type memory element is a dynamic random access memory cell, and the non-volatile memory element has a floating gate tunnel oxide structure.

11. A method of manufacturing a semiconductor device according to claim 10, wherein the dielectric film has smaller thickness than the gate insulation film of the MISFET in the dynamic random access memory cell.

12. A method of manufacturing a semiconductor device according to claim 11, the method further comprising the step of:
    forming the first electrode of the capacitor element and a semiconductor region connected to a drain region of the non-volatile memory element,
    wherein the first electrode of the capacitor element and the semiconductor region are disposed in the semiconductor substrate, and the semiconductor region extends below the tunnel insulation film.

13. A method of manufacturing a semiconductor device according to claim 12, wherein the dynamic random access memory is formed in the first region of the semiconductor substrate, and the non-volatile memory elements are formed in the second region of the semiconductor substrate.

14. A method of manufacturing a semiconductor device according to claim 1 wherein said dielectric film and said tunnel insulation film are formed in the same film thickness.

15. A method of manufacturing a semiconductor device according to claim 1 wherein said tunnel insulation film of said non-volatile memory element is formed by a silicon oxide film.

16. A method of manufacturing a semiconductor device according to claim 1 wherein said dielectric film of said capacitance element is formed in a single layer of a silicon oxide film, a silicon nitride film or a tantalum oxide film, or in a composite film of these films.

17. A method of manufacturing a semiconductor device according to claim 1 wherein said first and second electrode of said capacitance element electrode of said MISFET, and said control gate electrode of said non-volatile memory element are formed in a single layer of a polycrystalline silicon film, a high melting point metal silicide film or a high melting point metal film, or in a composite film of these films.

18. A method of manufacturing a semiconductor device having dynamic type memory elements each comprising a series circuit of a capacitance element and a MISFET on a first region of a substrate, and non-volatile memory elements on a second region of said substrate, said method comprising the step of;
   (a) simultaneously forming a first electrode of said capacitance element onto said first region and a semiconductor region connected to a drain region of said non-volatile memory element onto said second region;
   (b) simultaneously forming a dielectric film of said capacitance element onto said first electrode in said first region and a tunnel insulation film of said non-volatile memory element onto said semiconductor region connected to a drain region in said second region;
   (c) simultaneously forming a second electrode of said capacitance element onto said dielectric film and a gate electrode of said MISFET in said first layer and a floating gate electrode of said non-volatile memory element onto said tunnel insulation film in said second region;
   (d) forming a control gate electrode of said non-volatile memory element in said second region; wherein said dynamic type memory elements each comprising said capacitance element which has said first electrode, said second electrode and said dielectric film positioned therebetween, and said MISFET having said gate electrode are formed on said first region of said substrate, and said non-volatile memory elements comprising said floating gate electrode, said control gate electrode and said tunnel insulation film positioned between said floating gate electrode and said semiconductor region are formed on said second region of said substrate.

19. A method of manufacturing a semiconductor device according to claim 18 wherein said dielectric film and said tunnel insulation film are formed in the same film thickness.

20. A method of manufacturing a semiconductor device according to claim 18 wherein said tunnel insulation film of said non-volatile memory element is formed by a silicon oxide film.

21. A method of manufacturing a semiconductor device according to claim 18 wherein said dielectric film of said capacitance element is formed in a single layer of a silicon oxide film, a silicon nitride film or a tantalum oxide film, or in a composite film of these films.

22. A method of manufacturing a semiconductor device according to claim 18 wherein said first and second electrode of said capacitance element and the gate electrode of said MISFET are formed in a single layer of a polycrystalline silicon film, a high melting point metal silicide film or a high melting point metal film, or in a composite film of these films.

23. A method of manufacturing a semiconductor device having dynamic type memory elements comprising a series circuit of a capacitance element and a MISFET on a first region of a substrate, and non-volatile memory elements on a second region of said substrate, said method comprising the steps of:
   (a) simultaneously forming a first electrode of said capacitance element onto said first region and a floating gate electrode of said non-volatile memory element onto said second region;
   (b) simultaneously forming a dielectric film of said capacitance element onto said first electrode in said first region and a gate insulation film of said non-volatile memory element onto said floating gate electrode in said second region; and
   (c) simultaneously forming a second electrode of said capacitance element onto said dielectric film in said first region and a control gate electrode of said non-volatile memory element onto said gate insulation film in said second region,
   wherein said dynamic type memory elements each comprising said capacitance element having said first electrode, said second electrode and said dielectric film positioned therebetween are formed on said first region of said substrate; and said non-volatile memory elements comprising said floating gate electrode, said control gate electrode and said gate insulation film positioned between said floating gate electrode and said control gate electrode are formed on said second region of said substrate; and
   wherein said dielectric film of said capacitance element is formed in a single layer of a silicon oxide film, a silicon nitride film or a tantalum oxide, or in a composite film of these films.

24. A method of manufacturing a semiconductor device according to claim 1 wherein said first and second electrode of said capacitance element, said gate electrode of said MISFET and said control gate electrode of said non-volatile memory element are formed in a single layer of a polycrystalline silicon film, a high melting point metal silicide film or a high melting point metal film, or in a composite film of these films.

* * * * *